United States Patent [19]

Sawada et al.

[11] Patent Number: 5,450,341
[45] Date of Patent: Sep. 12, 1995

[54] NON-VOLATILE SEMICONDUCTOR MEMORY DEVICE HAVING MEMORY CELLS, EACH FOR AT LEAST THREE DIFFERENT DATA WRITABLE THEREINTO SELECTIVELY AND A METHOD OF USING THE SAME

[75] Inventors: Kikuzo Sawada; Toshio Wada; Yoshikazu Sugawara, all of Tokyo, Japan

[73] Assignee: Nippon Steel Corporation, Tokyo, Japan

[21] Appl. No.: 216,874

[22] Filed: Mar. 23, 1994

Related U.S. Application Data

[63] Continuation-in-part of Ser. No. 112,997, Aug. 30, 1993, Pat. No. 5,412,601.

[30] Foreign Application Priority Data

| Aug. 31, 1992 | [JP] | Japan | 4-255608 |
| Aug. 31, 1992 | [JP] | Japan | 4-255609 |
| Aug. 31, 1992 | [JP] | Japan | 4-255610 |
| Mar. 25, 1993 | [JP] | Japan | 5-092571 |

[51] Int. Cl.⁶ ............................................. G11C 11/56
[52] U.S. Cl. ............................ 365/185; 365/184; 365/218
[58] Field of Search ............... 365/168, 185, 184, 104, 365/218

[56] References Cited

U.S. PATENT DOCUMENTS 5,043,940 8/1991 Harari ................................. 365/168
5,119,330 6/1992 Tanagawa ........................... 365/185
5,287,305 2/1994 Yoshida .............................. 365/168

OTHER PUBLICATIONS

A 16kb Electrically Erasable Non-Volatile Memory, Johnson et al., 1980, IEEE, ISSCC, Dig. Tech. PAP. pp. 152–153, 271.
Analysis and Modeling of Floating-Gate EEPROM Cells, Kolodny et al., IEEE Trans., Electron Devices, Jun. 1986, ED-33, No. 6, pp. 835–844.
Semiconductor MOS Memory and Method of Using the Same, Nikkan Kogyo Newspaper Co., 1990, pp. 96–101.
A novel Cell Structure Suitable For a 3 Volt Operation, Sector Erase Flash Memory, Onoda et al., IEDM 1992, pp. 509–602.

*Primary Examiner*—David C. Nelms
*Assistant Examiner*—Vu A. Lê
*Attorney, Agent, or Firm*—Pollock, Vande Sande & Priddy

[57] ABSTRACT

A method of writing or reading at least three different data in each memory cell, in a non-volatile semiconductor memory device having a plurality of memory cells, each memory cell having floating gate for setting a given threshold voltage in the memory cell. In addition, a non-volatile semiconductor memory device capable of checking if the data stored in the selected memory cell is correct by using one of at least two binary bits of the data as a parity bit, and a method of writing or reading data in or from that memory device.

11 Claims, 13 Drawing Sheets

NON-VOLATILE SEMICONDUCTOR MEMORY DEVICE HAVING MEMORY CELLS, EACH FOR AT LEAST THREE DIFFERENT DATA WRITABLE THEREINTO SELECTIVELY AND A METHOD OF USING THE SAME

CROSS-REFERENCE TO RELATED APPLICATIONS

This application is a continuation-in-part of U.S. patent application Ser. No. 08/112,997 filed on Aug. 30, 1993 issue May 20, 1995 U.S. Pat. No. 5,412,601.

BACKGROUND OF THE INVENTION

1. Field of the Invention

This invention relates to a non-volatile semiconductor memory device and a method of using the same, and particularly to a non-volatile semiconductor memory device capable of storing at least three different data in each memory cell and to a method of writing or reading data in or from that memory device.

2. Description of the Related Art

The prior art documents disclosing the non-volatile semiconductor memory device, which the present invention relates to, are listed as follows;

Document 1: A 16 Kb Electrically Erasable Nonvolatile Memory, 1980, IEEE, ISSCC, Dig. Tech. Pap., pp 152–153, 271, 1980.

Document 2: Analysis and Modeling of Floating-Gate EEPROM Cells, IEEE Trans., Electron Devices, 1986, June, ED-33, No.6, pp 835–844.

Document 3: Semiconductor MOS Memory and Method of Using the Same, Nikkan Kogyo Newspaper Co., 1990, pp 96–101.

Document 4: A Novel Cell Structure Suitable For A 3 Volt Operation, Sector Erase Flash Memory, IEDM 92, pp.599–602 (1992).

Document 5: Flash EEPROM Memory Systems Having Multistate Storage Cells, U.S. Pat. No. 5,043,940 (1991).

A non-volatile semiconductor memory device in which the recorded data is not lost even if the power supply is turned off (this is called PROM) has already been developed and practically used since the early 1970's. In addition, another non-volatile semiconductor memory device (hereinafter, referred to as EEPROM) which is electrically erasable has been practically used since the 1980's, as described in the document 1. In the write operation of a memory cell of the EEPROM, the memory cell of a transistor-structure having a floating gate is charged with electrons and discharged through a thin insulating oxide film according to the Fowler-Nordheim tunneling effect, so that the threshold voltage of the transistor can be controlled (see documents 1 and 2). The threshold value of the memory cell is increased by injecting electrons into the floating gate and decreased by discharging electrons and injecting holes.

For example, FIG. 2 of document 3 shows the functional block diagram of this EEPROM. FIG. 13 in this application is a circuit block diagram of the conventional EEPROM which is given for comparison with the present invention. In FIG. 13, there are shown 144 memory cells of 4 columns and 36 rows, in which nine bits in data are simultaneously read or programmed. In order to make programming, erasing or reading for the 144 selective memory cells, it includes, as illustrated, decoder circuits, multiplexers, address buffers, a chip control circuit, a high-voltage generation/control circuit, a programming circuit, a sense circuit, data input buffer and data output buffer.

In FIG. 13, there are also shown address input terminals 501, 502, 503 and 504 which are used for inputting the address data of a memory cell selected by column and row lines. Input control terminals 505, 506 and 507 are used for inputting control signals for controlling the operation mode of the EEPROM; that is, the input terminal 505 is used for inputting a chip selection signal, the input terminal 506 for inputting an output selection signal, and the input terminal 507 for inputting a write signal. There are shown input/output terminals 508 through 516 from which the stored data of the selected memory cells are read out in the read mode and to which the data to be stored in the memory cells are supplied in the write mode.

Address buffers 517 through 520 function to buffer and output the address data and to reduce the consumption current in the input portion in response to a power-down signal. Another conventional technique is known (see document 3) in which the address buffer has an additional function of latching the address data in response to a latch signal in the write mode.

A chip control circuit 521 is responsive to the control signals at the control input terminals 505, 506 and 507 to select the read mode, write mode, power-down mode (or standby mode) and output nonselection mode. The chip control circuit 521 also includes the function by which the erase mode and program mode are automatically terminated in accordance with the internal timer. The write mode is further divided into two different modes, the erase mode and the program mode. In the erase mode, the selected memory cell or memory cells of a memory block are brought into the erased state in order to write other data into the memory cell or cells. The erased state of the memory cell means that the threshold value of the memory cell is higher (or lower) than the gate voltage in the read operation. In the program mode, the selected memory cell is in the programmed state in accordance with the input data. The programmed state means that the threshold value of the memory cell is lower (or higher) than the gate voltage in the read operation. When the memory cell is rewritten with other data, the erase mode is selected so that the memory cell is made into the erase state, and then into the programmed state in accordance with the input data. In other words, the write mode includes the erase mode and the program mode.

A column decoder 522 decodes the outputs from the address buffers 517 and 518, and applies a high (H) voltage only to the column line (the word line) of the selected memory cell, and a low voltage to the column lines of the non-selected cells. The high voltage upon selection is about the power supply voltage in the read mode, but becomes high in the write mode.

A row decoder 523 decodes the outputs from the address buffers, and it supplies a high voltage to the row line (bit line) of a selected memory cell and a low voltage to the row lines of the non-selected memory cells through multiplexers 529 and 537.

A high-voltage generation/control circuit 524 has a circuit for increasing the power supply voltage supplied to the EEPROM in the write mode to generate a high voltage of about 10 through 25 V (referred to as charge pump circuit), and a control circuit for supplying a desired high voltage to respective circuits of the EE- PROM in accordance with the erase mode or program mode.

A sense circuit 525 detects and amplifies the voltage value or current value on a data line 614 to which the data of the selected memory cell is transmitted in the read mode through the row line and multiplexers 529 through 537, and the amplified voltage or current value is outputted to a data output buffer 527.

A program circuit 526 receives a signal of program mode and the high voltage and supplies a high or low voltage depending on the input data to the data line 614. In this case, the conventional EEPROM can produce only a high voltage or low voltage (normally 0 V) signal.

The data output buffer 527 receives the data from the sense circuit 525 and supplies it to the output terminal in the read mode. Also it has a function of inhibiting the output in the power-down mode or the output non-selection mode.

A data input buffer 528 buffers the input data from the input/output terminal 516 and supplies it to the program circuit 526 in the write mode. Another data input buffer is known which has a function of latching the input data in the write mode in response to the latch signal.

Each of the multiplexers 529 through 537 connects the selected row line to a data line 614 or 629 through 636 in accordance with the signal from the row decoder 523. The voltage from the row decoder 523 is about that of the power supply voltage in the read mode and a high voltage in the write mode.

There are shown column lines 617, 618, 619 and 620, and row lines 637 through 672. There are also shown memory sense program lines 625, 626, 627 and 628, and memory cells 542 through 557. Each memory cell includes one select transistor and one memory transistor, and has the same structure and connection as shown in FIGS. 2 and 3 of document 1. In the memory cell shown in FIG. 3 of document 1, the column line is connected to the gate of the select transistor, the row line to the drain of the select transistor, and the memory sense program line to the gate of the memory transistor.

In FIG. 13, the upper and right side terminals of each of the blocks 542 through 557 indicating the respective memory cells are connected to the gate and drain of the select transistor, respectively, and the lower and left side terminals thereof to the gate and source of the memory transistor, respectively.

Each of MARY 1 through MARY 3 has three memory cell arrays MARY 01 through MARY 03 of the same structure and connection. Each memory cell array is formed of memory cells of four rows and four columns. The upper side terminals of the memory cells of respective columns are connected to the column lines 617 through 620, the lower side terminals of the memory cells of respective columns to memory sense program lines 625 through 628, and the left side terminals of all the memory cells to a memory ground line 610.

A circuit block DI01 includes the program circuit, the sense circuit, the data input buffer and the data output buffer. The data line to these circuits is represented by reference numeral 614, and the input/output terminal to these circuits is represented by reference numeral 516. Shown at 615 is the output from the data input buffer 528 and also the input to the program circuit 526, and at 616 is the output from the sense circuit 525 and also the input to the data output buffer 527. The circuit blocks DI02 . . . DI09 have the same construction as the circuit block DI01. The data lines to those blocks are represented by reference numerals 629 through 636, respectively, and the input/output terminals to those blocks by reference numerals 515 through 508, respectively.

Shown at 601 is the output from the address buffer 517 and the input to the column decoder 522, at 602 is the output from the address buffer 518 and the input to the column decoder 522, and at 603 is the output from the address buffer 519 and the input to the row decoder 523. Shown at 604 is the output from the address buffer 520 and the input to the row decoder 523, and at 621 through 624 are the outputs from the row decoder 523 and the inputs to the multiplexers 529 through 537.

Shown as 605 is the power down signal from the chip control circuit 521. This signal is supplied to the address buffers 517 through 520. Shown as 606 is a read enable signal for activating or inactivating the sense circuits 525 of the blocks DI01 through DI09. Shown at 607 is the program signal which, in the program mode, activates the program circuits 526 of the blocks DI01 through DI09 and causes the high-voltage generation/control circuit 524 to generate high voltages on high voltage lines 608 and 609 and a memory sense line 611 to be kept at 0 V. Shown at 673 is the erase signal for causing the high-voltage generation/control circuit 524 to generate the high voltage at the outputs 608 and 611 in the erase mode. Reference numeral 612 denotes a data input enable signal for activating the data input buffers 528 of the blocks DI01 through DI09 in the write mode, and 613 is a data output enable signal for activating the data output buffers 527 of the blocks DI01 through DI09 in the read mode.

Reference numeral 608 is a first high voltage signal which is supplied from the high voltage generation/control circuit 524 to the column decoder 522 and the row decoder 523 in the write mode. Shown as 611 is a memory sense signal which is at 0 V in the program mode, at the high voltage in the erase mode and at an intermediate voltage between 0 V to the power supply voltage in the reading mode. Shown as 609 is a second high voltage signal which is at the high voltage in the program mode.

Circuit blocks 538 through 541 connect the memory sense signal 611 from the high voltage generation/control circuit 524 to one of the memory sense program lines 625 to 628 corresponding to one column selected by the signals on the column lines 617 through 620.

The write operation and read operation of the conventional EEPROM will be described briefly. In the read operation, the control signals applied to the control input terminals 505, 506 and 507 are rendered into the read mode, and the selected address data are applied to the address input terminals 501, 502, 503 and 504. The input address data are buffered by the address buffers 517 through 520, and decoded by the column decoder 522 and row decoder 523.

A selected one of the four output signal lines of the column decoder 522 which are respectively connected to the column lines 617 through 620 is at a high voltage (normally about the power supply voltage), and the other three signal lines are at a low voltage. In addition, one row line is selected from the row lines 637 through 640 by the outputs 621 through 624 from the row decoder 523 and the multiplexer 529. Only the selected one row line is electrically connected to the data line 614 through a low impedance.

Similarly, the row lines selected, respectively, by the outputs 621 through 624 of the row decoder 523 and multiplexer 530, the outputs 621 through 624 and multiplexer 531, ..., the outputs 621 through 624 and multiplexer 537 are electrically connected to the data lines 629 through 636 through a low impedance. At this time, a threshold detection voltage of, for example, 2 through 4 V corresponding to the detected threshold value of the memory cell is supplied to the memory sense line 611 and fed through the memory sense program line selecting circuits 538 through 541 only to the selected one of the memory sense program lines. The memory ground line 610 is in the grounded state.

The voltage from the corresponding sense circuit (for example, 525 in DI01) is supplied to the row line of the selected memory cell. When the threshold voltage of the memory cell is lower than the threshold detection voltage, the memory cell transistor is turned on and thus a current flows from the row line to the memory ground line 610. When the threshold voltage of the memory cell is higher than the threshold detection voltage, the selected memory cell transistor is turned off and thus no current flows from the row line to the memory ground line 610. The voltage on the row line is set by the sense circuit, and the current to the row line in the read mode is supplied from the sense circuit. The sense circuit detects and amplifies this current, thereby outputting the stored data in the memory cell on the line 616 in, for example, DI01 as a binary value of a high or low voltage, which is fed through the data output buffer 527 to the outside. If the threshold value of the memory cell is as high as 6 V, a high voltage is produced at the input/output terminal 516. If the threshold value of the memory cell is as low as 0 V, a low voltage is produced at the input/output terminal. The sense circuit and data input buffer in DI02 through DI09 have the same functions as those in DI01.

In the write mode operation, the data in the memory cell is erased first. In this prior art, the data erasing is normally effected at a time or the memory cells in one column line, but may be effected on the memory cells for one byte or block. Although the erase mode in the prior art is effected by the control input to the input terminals 505, 506, 507, it is also possible to effect the erase mode by the input data to the data input buffer 528 in addition to the control input. In the erase mode, the column line of the memory cell is selected by the address data from the address input terminals 501, 502. The high voltage line 608 is kept at a high voltage and the column line of the selected memory cell is at a high voltage and 0 V is fed to the column lines of the other memory cells. In addition, the memory sense line 611 is at a high voltage and the memory sense program line of the column line of the selected memory cell is at a high voltage by the memory sense program line selecting circuits 538 through 541.

The sense circuit and program circuit (for example, 525, 526 in DI01) are not activated in the erasing mode, and the data line 614, 629 through 636 are at 0 V or in the floating state. The memory ground line 610 is grounded in the erasing mode. Thus, a high voltage (for example, 20 V) is applied to the gate of the memory cell of the selected column line and the drain and source are grounded. At this time, the Fowler-Nordheim tunnel phenomenon occurs, causing electrons to be injected from the drain into the floating gate so that the threshold value of the memory cell transistor becomes high (for example, 5 through 8 V).

When programming the erased memory device, the device is rendered to the program mode and the address of the memory cell to be programmed is inputted to the address input terminals 501, 502, 503, 504. In the program mode, the high voltage line 608 is set at a high voltage, the memory sense line 611 is at 0 V, and the high voltage line 609 is set at a high voltage. Also the memory ground line 610 is in the floating state. The column decoder 522, the row decoder 523, the program circuits 519, 523 and the data input buffers 520 in DI01 through DI09 are activated, while the sense circuits and the data output buffers are inactivated. In other words, when a low voltage is supplied as input data to the input/output terminal 516, the program circuit 526 produces a high voltage (for example, 20 V) on the data line 614, and when a high voltage is supplied to the input/output terminal 516, it produces 0 V on the data line 614. When the data line 614 is at a high voltage, the selected row line is at a high voltage (for example, 20 V), since the selected one of the outputs 621 through 624 is also at a high voltage. The selected column line is also at a high voltage and the memory sense program lines are at 0 V. Thus, the gate of the memory cell transistor is at 0 V, and the drain is at a high voltage (for example, 20 V). At this time, the Fowler-Nordheim tunneling is caused to discharge electrons from the floating gate to the drain, and inject holes from the drain into the floating gate, so that the threshold voltage of the memory cell transistor is reduced to, for example, $-3$ V to 0 V.

It is also known that in order to improve the reliability of data in the above semiconductor memory device, one of the input/output terminals 508 through 516, for example, in FIG. 13 is used for a parity bit by which the presence or absence of error in the information stored in the memory cells can be detected.

The circuit function of the conventional EEPROM has been described as above. The Fowler-Nordheim tunnel current used for writing the memory cell is proportional to the electric field applied across the insulating film (see document 2). The threshold value of the memory cell transistor is changed linearly with the high voltage in the erase or program mode (see document 2). In the conventional EEPROM, only one high voltage value is used in each of the erase mode and program mode and hence in the read mode, only a binary value of a high or low value is detected.

SUMMARY OF THE INVENTION

It is a first object of the present invention to provide a method of writing or reading at least three different data in or from each memory cell of a non-volatile semiconductor memory device.

It is a second object of the invention to provide a non-volatile semiconductor memory device capable of storing at least three different data in each cell and having a parity check function for checking if the stored data has error, and a method of writing or reading data in or from this non-volatile semiconductor memory device.

According to one aspect of the present invention, a method of writing data into a non-volatile semiconductor memory device having a plurality of memory cells, each of which has a control gate for setting its threshold voltage, comprises the steps of: determining at least three threshold voltage values corresponding to at least three different data for each of the plurality of memory cells; determining at least three voltage signals of different characteristics to be applied to the control gate of each memory cell for setting the memory cell at the at least three different threshold voltage values; selecting one of the plurality of memory cells to be written into; and applying to the control gate of the selected memory cell one of the at least three voltage signals of different characteristics corresponding to one of the at least three different data which is to be written into the selected memory cell.

In the above method, the at least three voltage signals of different characteristics are any of voltage signals having different voltage levels, voltage signals of different numbers of pulses each having the same level and the same pulse width and voltage signals of pulses having the same level but different pulse widths.

According to another aspect of the present invention, a method of reading data from a non-volatile semiconductor memory device having a plurality of memory cells each of which can be set at any one of the threshold voltages corresponding to at least three different data comprises the steps of: selecting one of the memory cells to be read out; providing different reference voltages corresponding to the different threshold voltages; determining a level of the one of the threshold voltages at which the selected memory cell is set by comparing it with the different reference voltage levels; and determining the data written in the selected memory cell from the determined threshold voltage level.

According to further aspect of the present invention, a non-volatile semiconductor memory device comprises: a plurality of memory cells, each memory cell being able to store any one of different data represented by at least two binary bits, and the plurality of memory cells being divided into a plurality of memory cell groups, each group including at least two memory cells; means for selecting one of the plurality of memory cell groups; means for storing into the selected group of memory cells composite data including a parity bit and object data represented by a plurality of binary bits, while distributing all bits of the composite data into the memory cells; and means for reading the composite data including the object data and the parity bit stored in the selected memory cell group.

According to another aspect of the present invention, a method of writing data in a non-volatile semiconductor memory device including a plurality of memory cells, each memory cell having a control gate for setting its threshold voltage, the method comprises the steps of: determining beforehand different threshold voltages to be set in each of the plurality of memory cells, the different threshold voltages corresponding to different data represented by at least two binary bits; determining voltages signals of different characteristics to be applied to the control gate of each of the memory cells for setting the different threshold voltages in the memory cell; dividing the plurality of memory cells into a plurality of groups each group including at least two memory cells; selecting one of the plurality of memory cell groups; assigning all bits of composite data including one parity bit and object data represented by a plurality of binary bits to be written, into the memory cells of the selected memory cell group; and applying to the control gate of each memory cell of the selected group one of the voltage signals of different characteristics corresponding to the one of the bits of the composite data assigned to the memory cell.

According to another aspect of the present invention, a method of reading data written in a non-volatile semiconductor memory device including a plurality of memory cells, each memory cell having a threshold voltage which is suitable at any of different levels corresponding to different data represented by at least two binary bits, which method of comprises the steps of: dividing the plurality of memory cells into a plurality of memory cell groups, each group including at least two memory cells; providing different reference voltages correspondingly to the different threshold voltages; selecting one of the plurality of memory cell groups; comparing the threshold voltage set in each of the memory cells of the selected group with the different reference voltage levels and determining the level of the threshold voltage set in each memory cell of the selected group on the basis of that comparison; determining composite data including a parity bit and object data written in the selected memory cell group from the levels of the respective threshold voltages, as determined, set in the memory cells included in the selected group; determining whether the determined composite data is correct or not from a number of binary bits of a predetermined level included in the composite data; and determining the object data from the composite data when the composite data is decided to be correct.

DESCRIPTION OF THE PREFERRED EMBODIMENTS

Figure 1:
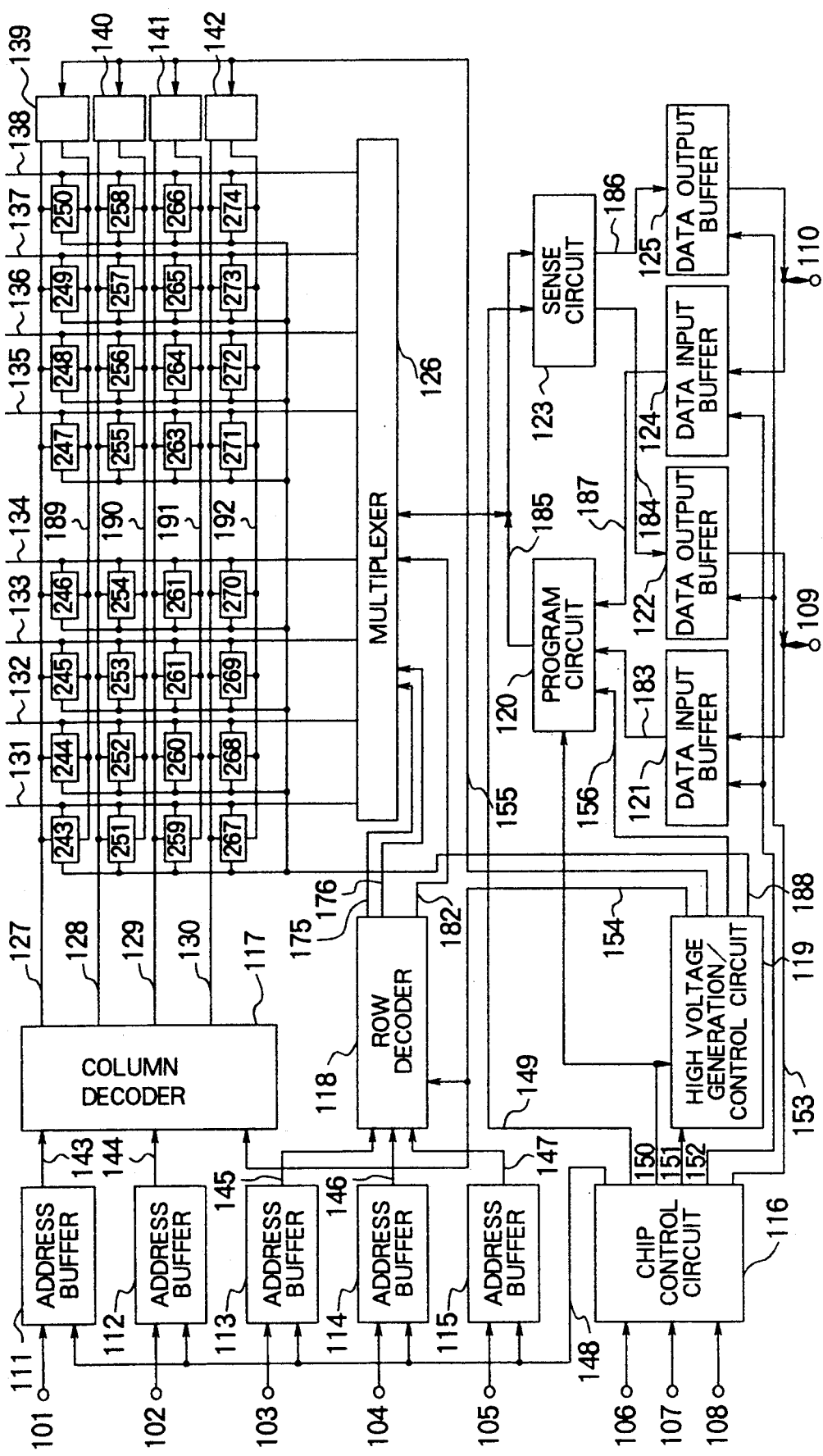
FIG. 1 is a circuit block diagram of an EEPROM of a first embodiment of the present invention.
Figure 2:
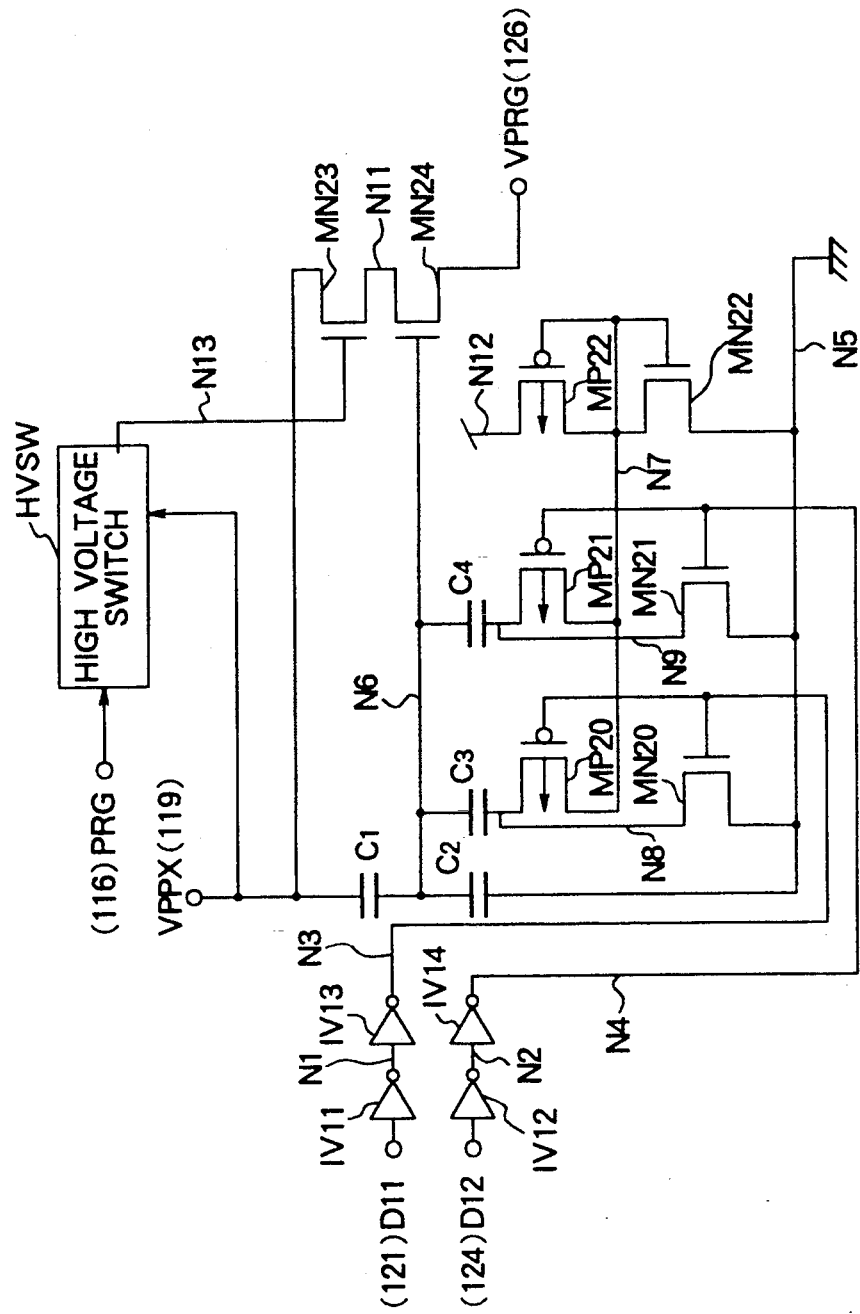
FIG. 2 is a detailed diagram of the program circuit of the first embodiment of the invention.
Figure 3:
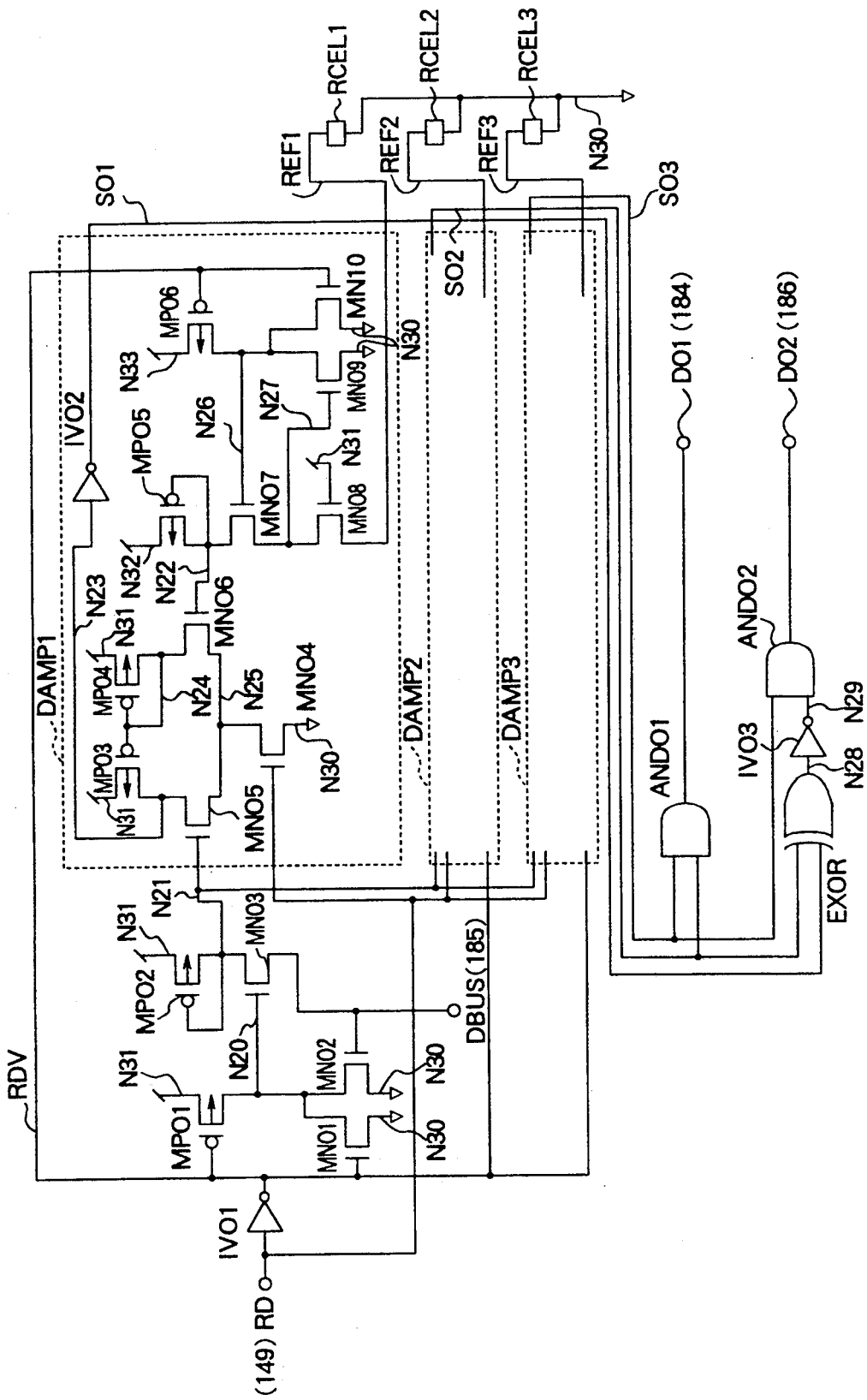
FIG. 3 is a detailed diagram of the sense circuit of the first embodiment of the invention.

The first embodiment of the invention will be described with reference to FIGS. 1 through 3. FIG. 1 is a block diagram of an EEPROM of this embodiment. FIG. 2 is a detailed diagram of the program circuit shown in FIG. 1, and FIG. 3 is a detailed diagram of the sense circuit shown in FIG. 1. Referring to FIG. 1, there are shown address input terminals 101, 102, 103, 104 and 105, control input terminals 106, 107 and 108, and data input/output terminals 109 and 110. There are also shown address buffers 111, 112, 113, 114 and 115, a chip control circuit 116, a high-voltage generation/control circuit 119, a column decoder 117, a row decoder 118, memory cells 243, 244, . . . , 274, memory sense program line selection circuits 139, 140, 141 and 142, a multiplexer 126, a program circuit 120, a sense circuit 123, data input buffers 121 and 124, and data output buffers 122 and 125. The memory cells 243, 244 . . . 274 have their floating gates into which electrons are charged through, for example, a thin insulating film. The shape of the memory cell is not limited to a specific one.

There are also shown column lines (word lines) 127, 128, 129 and 130 which connect the outputs of the column decoder to the selection gates (not shown) of the memory cells and to the memory sense program selection circuits 139 through 142, respectively. Switching control signal lines 175 through 182 are connected to the multiplexer 126. Row lines (bit lines) 131, 132, . . . , 138 are connected to the drains (not shown) of the memory cells and to the multiplexer 126. A read enable signal is fed through a signal line 149 to the sense circuit 123. A program enable signal is fed through a signal line 150 to the program circuit 120 and the high voltage generation/control circuit 119. An erase signal is fed through a signal line 151 to the high-voltage generation/control circuit 119. A data input enable signal is supplied to the data input buffers 121 and 124 through a signal line 152. A data output enable signal is supplied from the chip control circuit 116 through a signal line 153 to the data output buffers 122 and 125.

The output from the program circuit 120 is transmitted through a data line 185 to the sense circuit 123 and the multiplexer 126. A high voltage signal from the high-voltage generation/control circuit 119 is supplied through a high-voltage line 154 to the column decoder 117 and the row decoder 118. The output from the high-voltage generation/control circuit 119 is supplied through a memory sense voltage line 155 to the memory sense program line selection circuits 139, 140, 141 and 142. The output from the high-voltage generation/control circuit 119 is supplied through a program high voltage line 156 to the program circuit 120. A memory ground line 188 is connected to the source terminals (not shown) of the memory cells 243, . . . , 274.

The operation of the EEPROM of this embodiment shown in FIG. 1 will be described below.

The EEPROM shown in FIG. 1 operates in any of the read mode, the write mode, the power-down mode (or the standby mode) and the output non-selection mode. The write mode is divided into the erase mode and the program mode.

First, the read mode will be described.

In the EEPROM of this embodiment, three-bit control input data for controlling the operation mode of the EEPROM is supplied to the control input terminals 106, 107 and 108, thereby setting the chip control circuit 116 to the read mode. Then, the address data for a desired memory cell is supplied to the address input terminals 101, 102, 103, 104 and 105. The input address data is buffered in the address buffers 111, 112, 113, 114 and 115. The output data from the address buffers 111 and 112 is decoded by the column decoder 117 to be outputted on the column lines 127, 128, 129 and 130. Of these column lines, the column line selected by the address data is at a high voltage, and the other three lines are at a low voltage. The outputs from the address buffers 113, 114 and 115 are decoded by the row decoder 118 to be outputted on the signal lines 175 through 182, so that the multiplexer 126 connects one of the row lines 131 through 138 to the data line 185. Thus, one of the memory cells (for example, the memory cell 252 at the intersection between the lines 128 and 132) is selected. The chip control circuit 116 produces a high voltage on the signal lines 149 and 153 and a low voltage on the other signal lines 150, 151 and 152. Thus, the sense circuit 123 and the data output buffers 122 and 125 are activated, and the high-voltage generation/control circuit 119, the data input buffers 121 and 124 and the program circuit 120 are inactivated. The high-voltage line 154 is at about the source voltage, the memory cell voltage line 155 is at, for example, 3 V, the program high-voltage line 156 is at, for example, a low voltage, and the memory ground line 188 is grounded. The sense circuit 123 is activated by the high voltage on the signal line 149 to perform amplification, comparison for detection and restoration of the voltage appearing on the data line 185 and produce outputs which are supplied to the data output buffers 122 and 125. The data output buffers 122 and 125 produce at the data input/output terminals 109, 110 the data stored in the selected memory cell.

The erase mode will be described below.

Data from the outside is applied to the control terminals 106, 107, 108 for setting the chip control circuit at the erase mode, and the address data for the column line to be erased is supplied to the address input terminals 101, 102. The chip control circuit 116 produces a low voltage on the signal lines 149, 150, 152 and 153, and a high voltage on the signal line 151. Thus, the high-voltage generation/control circuit 119 is activated, and the program circuit 120, the sense circuit 123, and the data output buffers 122, 125 are in-activated. The high-voltage line 154 is at a high voltage (for example, 20 V), the memory cell voltage line 155 is also at a high voltage (for example, 20 V), the program high-voltage line 156 is at a low voltage or about the source voltage, and the memory ground line 188 is grounded. As a result, one of the column lines 127, 128, 129, 130 is at a high voltage (for example, 20 V). Also, one of the signal lines 189, 190, 191, 192 is at a high voltage (for example, 20 V). Thus, each of the memory cell transistors having the floating gates connected to the selected column line is rendered to a state that its gate is at 20 V, its source is at ground potential, and its drain is at ground potential (because the memory cell transistor is turned on by the gate voltage). Consequently, the Fowler-Nordheim tunneling is caused thereby raising the threshold voltage to, for example, 5 V.

The program mode will be described.

In the program mode, control data is fed to the control input terminals 106, 107, 108, for setting the chip control circuit 116 to the program mode. The address data for the memory cell to be programmed is supplied to the address input terminals 101, 102, 103, 104, 105. The chip control circuit 116 produces a low voltage at the signal line 148, a high voltage on the signal line 150, a low voltage on the signal line 151, a low voltage on the signal line 152, and a low voltage on the signal line 153. Consequently, the high-voltage generation/control circuit 119, the data input buffers 121, 124, and the program circuit 120 are activated, and the data input/output buffer 122 and the sense circuit 123 are inactivated. The high-voltage line 154 becomes at a high voltage (for example, 23 V), the memory sense voltage line 155 is at ground potential, the program high-voltage line 156 is at a high voltage (for example, 23 V), and the memory ground line 188 is in a high-impedance state. As a result, one of the column lines 127, 128, 129, 130 is at a high voltage (for example, 23 V). One of the signal lines 175 through 182 is at a high voltage (for example, 23 V), and the multiplexer 126 is turned on to connect the selected row line to the line 185.

The input data in the program mode is supplied through the data input/output terminals 109, 110 to the data input buffers 121, 124 where it is buffered, and then it is fed to the program circuit 120. The program circuit 120 converts the input data into a program voltage and produces on the data line 185 the program voltage corresponding to the input data. In this embodiment, the program voltage value is a selected one of the four different voltage values (for example, 22 V, 20 V, 18 V, 16 V). The program voltage value may be selected from four or more different voltage values. If the selected column line and row line are respectively 128 and 132, the program voltage is fed through the multiplexer 126 to the row line 132, which is at, for example, 20 V. Since the memory sense voltage line 155 and the column line 128 are at ground potential and 23 V, respectively, the signal line 190 is rendered to the ground potential through the memory sense program line selection circuit 140. Thus, since the memory cell 252 is rendered to a state that its drain is at 20 V and its gate is at the ground potential, the threshold value of the memory cell is reduced to, for example, −0.5 V contrary to the erasing mode.

While in this embodiment only the control data is supplied to the control input terminals 106, 107, 108 in order to select one of the erase mode, the program mode and other modes, this embodiment is not limited to this way. In addition, while the memory cells in one column line are selected at a time in the erase mode, memory cells for one byte or block may be selected.

FIG. 2 is a detailed diagram of the program circuit 120 shown in FIG. 1. Referring to FIG. 2, there are shown a first data input terminal DI1, a second data input terminal DI2, a high-voltage input terminal VPPX, a program enable signal input terminal PRG, and a program voltage signal output terminal VPRG. There are also shown inverter circuits IV11, IV12, IV13, IV14, a high-voltage switch HVSW, capacitors C1, C2, C3, C4, MOS transistors of N-channel enhancement type MN20, MN21, MN22, MN23, MN24, and MOS transistors of P-channel enhancement type MP20, MP21, MP22.

N1 is the output signal line which is connected to the output of the inverter circuit IV11 and to the input of the inverter circuit IV13. N2 is the output signal line which is connected to the output of the inverter circuit IV12 and to the input of the inverter circuit IV14. N3 is the output signal line which is connected to the output of the inverter circuit IV13 and to the gate of the MOS transistor MP20 and the gate of the MOS transistor MN20. N4 is the output signal line which is connected to the output of the inverter circuit IV14 and to the gate of the MOS transistor MP21 and the gate of the MOS transistor MN21. N5 is the grounding node which is connected to ground potential and to one end of the capacitor C2, the source of the MOS transistor MN20, the source of the MOS transistor MN21 and the source of the MOS transistor MN22. An output signal line N7 is connected to the drain of the MOS transistor MP22, the source of the MOS transistor MP21, the source of the MOS transistor MP20 and the drain of the MOS transistor MN22. An output signal line N8 is connected to one end of the capacitor C3, the drain of the MOS transistor MP20 and the drain of the MOS transistor MN20. A signal line N9 is connected to one end of the capacitor C4, the drain of the MOS transistor MP21 and the drain of the MOS transistor MN21. A signal line N6 is connected to one end of the capacitor C1, the other end of the capacitor C2, the other end of the capacitor C3, the other end of the capacitor C4 and the gate of the MOS transistor MN24. A signal line N11 is connected to the source of the MOS transistor MN23 and the drain of the MOS transistor MN24. At a power supply node N12, the power supply is connected to the source of the MOS transistor MP22. A signal line N13 connects a high-voltage switch HVSW to the gate of the MOS transistor MN23. The high-voltage input terminal VPPX is connected to the other end of the capacitor C1, the drain of the MOS transistor MN23 and the high-voltage switch HVSW. The program enable signal input terminal PRG is connected to the control input terminal, not shown, of the high-voltage switch HVSW. The first data input terminal DI1 is connected to the input of the inverter circuit IV11, the second data input terminal DI2 to the input of the inverter circuit IV12, and the output terminal VPRG for the program signal to the source of the MOS transistor MN24.

The first data input terminal DI1 shown in FIG. 2 is connected to the data input buffer 121 shown in FIG. 1. The second data input terminal DI2 is connected to the data input buffer 124 shown in FIG. 1. The high-voltage input terminal VPPX is connected to the high-voltage generation/control circuit 119 shown in FIG. 1. The program enable signal input terminal PRG is connected to the chip control circuit 116 shown in FIG. 1. The output terminal VPRG for the program signal is connected to the multiplexer 126 shown in FIG. 1. The program circuit shown in FIG. 2 converts 2-bit digital data into analog data. When a high voltage (for example, 24 V) is applied to the high-voltage input terminal VPPX and the program enable signal input terminal PRG is at a high voltage, the voltage on the signal line N6 is rendered to a value determined by the capacitors C1, C2, C3, C4 and the signal line N7 as follows.

The voltage on the signal line N6={the voltage at the high-voltage input terminal VPPX×the value of the capacitance C1+the voltage on the signal line N7×(the value of the capacitor C3+the value of the capacitor C4)}/CT, where CT=C1+C2+C3+C4.

In this embodiment, the voltages on the signal lines N8 and N9 are changed between the ground potential and the voltage of the signal line N7 (for example, a constant voltage of about 3 V) in accordance with the input data so that the voltage on the signal line N6 is variable depending on the values at the first and second data input terminals DI1 and DI2. In addition, the input data is weighted by making different the values of the capacitors C3 and C4 (for example, the value of the capacitor C3 is twice as large as that of the capacitor C4), so that the voltage value on the signal line N6 can assume four values which have a proportional relation. When the program enable signal input terminal PRG is at a high voltage, the high-voltage switch HVSW produces a high voltage on the output line N13, the MOS transistor MN23 is turned on, and the output terminal VPRG for the program signal is at a voltage corresponding to the subtraction of the threshold value of the MOS transistor MN23 from the voltage on the signal line N6. When the signal line N6 is at a voltage of, for example, 21 V, the voltage at the output terminal VPRG is, for example, 20 V. In this embodiment, when the first and second data input terminals DI1 and DI2 are both at a high voltage, the output terminal VPRG is at the lowest voltage (for example, 16 V). When the first and second data input terminals DI1 and DI2 are both at a low voltage, the output terminal VPRG is at the highest voltage (for example, 22 V). When the input terminal PRG is at a low voltage, the signal line N13 is also at a low voltage, the MOS transistor MN23 is turned off, and the output terminal VPRG is in the floating state.

In FIG. 3, there are shown a read signal input terminal RD, a first data output terminal DO1, a second data output terminal DO2, and a memory read data input terminal DBUS. There are also shown inverter circuits IV01, IV02, IV03 which are formed of MOS transistors, two-input logic AND gates AND01, AND02 which are formed of MOS transistors, and a two-input exclusive logic OR gate EXOR which is formed of a MOS transistor. MOS transistors MP01, MP02, MP03, MP04, MP05, MP06 are of the P-channel enhancement type, and MOS transistors MN01, MN02, MN03, MN04, MN05, MN06, MN07, MN08, MN09, MN10 are of the N-channel enhancement type. RCEL1, RCEL2 and RCEL3 are memory cells for reference.

In addition, the drain of the MOS transistor MP01 is connected to the drain of the MOS transistor MN01, the drain of the MOS transistor MN02 and the gate of the MOS transistor MN03. The drain and gate of the MOS transistor MP02, the drain of the MOS transistor MN03 and the gate of the MOS transistor MN05 are connected to each other. The drain of the MOS transistor MP03 and the drain of the MOS transistor MN05 are connected to the input of the inverter circuit IV02. The drain and gate of the MOS transistor MP05, the drain of the MOS transistor MN07, and the gate of the MOS transistor MN06 are connected to each other. The drain of the MOS transistor MP06 is connected to the drains of the MOS transistors MN09 and MN10 and the gate of the MOS transistor MN07. The source of the MOS transistor MN07 is connected to the drain of the MOS transistor MN08 and the gate of the MOS transistor MN09. The output signal from the gate EXOR is supplied to the input of the inverter IV03, the output signal from the inverter circuit IV03 is supplied to the input of the gate AND02.

The circuits DAMP2 and DAMP3 have the same arrangement as the circuit DAMP1 mentioned above.

In FIG. 3, the input terminal RD is connected to the input of the inverter circuit IV01, the gate of the MOS transistor MN04 of the circuit DAMP1 and the circuits DAMP2 and DAMP3. The output RDV from the inverter circuit IV01 is supplied to the gate of the MOS transistor MP01, the gate of the MOS transistor MN01, the gates of the MOS transistors MP06 and MN10 of the circuit DAMP1, and the circuits DAMP2 and DAMP3. The memory read data input terminal DBUS is connected to the gate of the MOS transistor MN02 and the source of the MOS transistor MN03. The first data output terminal DO1 is connected to the output of the gate AND01, and the second data output terminal DO2 to the output of the gate AND02. An output signal line SO1 is connected to the output of the inverter circuit IV02 of the circuit DAMP01 and to the input of the EXOR, and an output line SO2 has one end connected to the output of the corresponding inverter circuit IV02 of the circuit DAMP2 and the other end connected to the input ends of the gates AND01 and EXOR. An output signal line SO3 has one end connected to the corresponding inverter circuit IV02 of the circuit DAMP3 and the other end connected to the input ends of the gates AND01 and AND02. A line REF1 is connected to the source of the MOS transistor MN08 of the circuit DAMP1 and the drain portion of the memory cell RCEL1 for reference. A line REF2 is connected to the source of the MOS transistor MN08 of the circuit DAMP2 and the drain portion of the memory cell RCEL2 for reference. A line REF3 is connected to the source of the MOS transistor MN08 of the circuit DAMP3 and the drain portion of the memory cell RCEL3 for reference. A ground node N30 is connected to the ground nodes of the inverter circuit, logic AND gate and exclusive logic OR gate, the source terminals of the MOS transistors MN01, MN02, MN04, MN09, MN10 and the source portions of the memory cells RCEL1, RCEL2, RCEL3 for reference. A power supply node N31 is connected to the power supply nodes of the inverter circuit, logic AND gate and exclusive logic OR gate, the sources of the MOS transistors MP01, MP02, MP03, MP04, MP05, MP06 and the gate of the MOS transistor MN08.

In FIG. 3, the read signal input terminal RD corresponds to the line 149 shown in FIG. 1, the memory read data input terminal DBUS to the line 185 shown in FIG. 1, the first data output terminal DO1 to the line 184 shown in FIG. 1, and the second data output terminal DO2 to the line 186 shown in FIG. 1. In the read mode, the read signal input terminal RD is at a high voltage, the data input terminal DBUS is at the same potential as the row line of the selected memory cell. Since the line RDV is at a low voltage, the MOS transistor MP01 is turned on, the MOS transistor MN01 is turned off, and the voltage at the node N20 rises from 0 V. When the voltage at the node N20 rises, the MOS transistor MN03 is turned on, and the memory read data input terminal DBUS is at a voltage corresponding to the voltage at the node N20 subtracted by the threshold value of the MOS transistor MN03. However, when the voltage at the memory read data input terminal DBUS becomes higher than the threshold value of the MOS transistor MN02, the MOS transistor MN02 is turned on, suppressing the potential of the memory read data input terminal DBUS from further increase. Thus, when the read signal input terminal RD is at a high voltage, the memory read data input terminal DBUS is at about an intermediate voltage between 0 V and the source voltage, or for example 2 V. At this time, if the memory to be read is in the on-state, a current flows from the memory read data input terminal DBUS to the source of the memory cell, so that the potential of the memory read data input terminal DBUS is somewhat reduced (for example, to a voltage of 1.8 V). In this case, since this current flows through the MOS transistor MP02, the voltage at the node N21 is greatly reduced (for example, reduced from 4.2 V to 3.5 V) by selecting the transistor MP02 of a proper size as compared with the voltage at the memory read data input terminal DBUS. Since the voltage at the node N21 is necessarily proportional to the magnitude of the current flowing through the memory cell, the MOS transistor MP01, MOS transistor MN02, and MOS transistors MN03 and MP02 amplify the potential variation at the memory read data input terminal DBUS. The MOS transistors MP03, MP04 and the MOS transistors MN05, MN06, MN04 constitute differential amplifiers, and the nodes N21 and N22 are differential inputs. The MOS transistors MP05, MP06, MN07, MN09, MN10 are analogous to the MOS transistors MP02, MP01, MN03, MN02, MN01, and make operation for the line REF1 similar to that for the memory read data input terminal DBUS.

If the threshold value of the memory cell to be read and the threshold values of the reference memory cells RCEL1, RCEL2 and RCEL3 are respectively assumed to be, for example, 1.5 V, 2.5 V, 0.5 V, and −1.5 V, the following condition is satisfied.

Voltage on REF3 < voltage on REF2 < voltage at memory read data input terminal DBUS < voltage on REF1. Thus, the output signal line SO1 of the circuit DAMP1 is at a low voltage, the output signal line SO2 of the circuit DAMP2 is at a high voltage, and the output signal line SO3 of the circuit DAMP3 is at a high voltage. The threshold value of the reference memory cell is previously set in the test mode or the like, and will not be described in this embodiment. As a result, the first data output terminal DO1 is at a high voltage, and the second data output terminal DO2 is at a low voltage. Similarly, when the threshold value of the memory cell is 3.5 V, the first data output terminal DO1 is at a high voltage, the second data output terminal DO2 is at a high voltage. When the threshold value of the memory cell is −0.5 V, the first data output terminal DO1 is at a low voltage, and the second data output terminal DO2 is at a high voltage. When the threshold value of the memory cell is −2.5 V, the first data output terminal DO1 is at a low voltage, and the second data output terminal DO2 is at a low voltage. Thus, the data stored in the memory cell can be satisfactorily read out.

Figure 9:
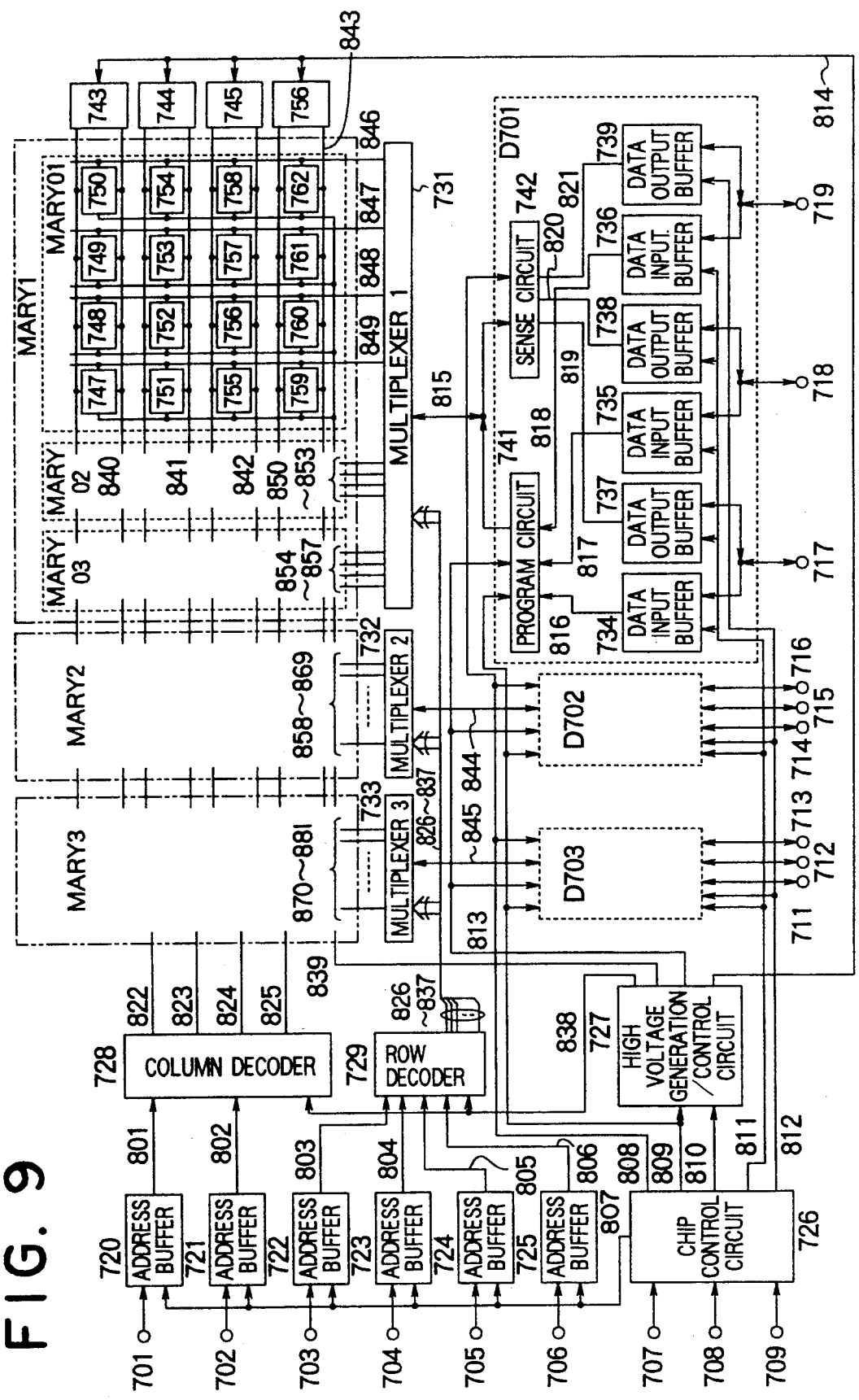
FIG. 9 is a circuit block diagram of the EEPROM of the fifth embodiment of the invention.

While the prior art shown in FIG. 9 has the four address inputs and two outputs provided for 32 memory cells, the embodiment shown in FIG. 1 has five address inputs and two outputs provided for 32 memory cells. Therefore, according to this embodiment, data twice as large as the amount of data in the prior art can be written in and read from the same number of the memory cells. Thus, the capacity of the semiconductor memory can be remarkably increased as compared with the prior art. In addition, if the capacity of storage in the embodiment is the same as in the prior art, the number of memory cells in this embodiment can be reduced to a half or less as compared with the prior art. Thus, the area of the integrated memory chip is greatly reduced to about a half so that the cost can be much lowered.

This invention is not limited to the above embodiment, but can take other various modifications without departing from the scope of the invention. For example, while in this embodiment the program voltage in the program mode is generated from the program circuit, it may be generated by the high-voltage generation/control circuit or other circuits. While in this embodiment the reference memory cell is included in the sense circuit, it may be included in part of the memory cells which are arranged in a matrix. In addition, while in this embodiment the four threshold values are set in the memory cell for convenience of explanation, more threshold values may be used.

Moreover, while the function of the EEPROM of this embodiment is simplified for convenience of explanation, other functions may be added to this function. For example, a verify mode or the like after programming can be easily added.

Also, while in this embodiment the memory cells are formed of transistors with floating gates and select transistors, the invention is not limited to this structure and may be of any structure in which the threshold values of the memory cells are changed in proportion to the program voltage value in the program mode.

According to this embodiment, as described above, twofold or more data can be written in and read from the same number of memory cells as that of the prior art, and thus it is possible to realize a semiconductor memory which has the capacity much larger than the conventional one. If the storage capacity is assumed to be constant, the number of memory cells in the semiconductor memory of the invention can be reduced to a half or less as compared with the prior art. Thus, when this memory is integrated as an IC memory, the chip area can be substantially halved, or greatly reduced in size, thus leading to low cost.

Moreover, according to this embodiment, in addition to the above effects, the external connection terminals are compatible with those of the conventional EEPROM. Thus, there is no need to reduce the function of the prior art or add new terminals for achieving function of this invention. This is because this invention is so constructed that parallel data access can be made to the program circuit and the sense circuit from a plurality of data input/output terminals.

Also, the sense circuit has a plurality of reference-purpose memory cells of different threshold values, and the memory cell to be read is compared with the reference memory cells so that high-precision reading can be realized. For example, another sense system would be considered in which the absolute value of current flowing in a memory cell is detected by a load transistor or the like. According to this system, if the current value in the memory cell is not stable due to the variation of characteristics caused upon production, it would be possible that the current value cannot be satisfactorily detected. On the other hand, the sense circuit of the present invention does not compare the absolute values of currents but compare relative values to the reference cells. Therefore, the above problem can be removed, and as a result the detection precision can be increased.

The second embodiment of the present invention will be described with reference to FIGS. 4 and 5. While in the first embodiment at least four signals of different voltage values are generated and stored in memory cells in the program mode, in the second embodiment at least four signals of different program voltage duration times are generated and stored in memory cells.

In this second embodiment, only the program circuit 120 is different from that shown in FIG. 1, and the other elements are the same as in the first embodiment. The program circuit 120 of this embodiment will be described with reference to FIG. 4.

Figure 4:
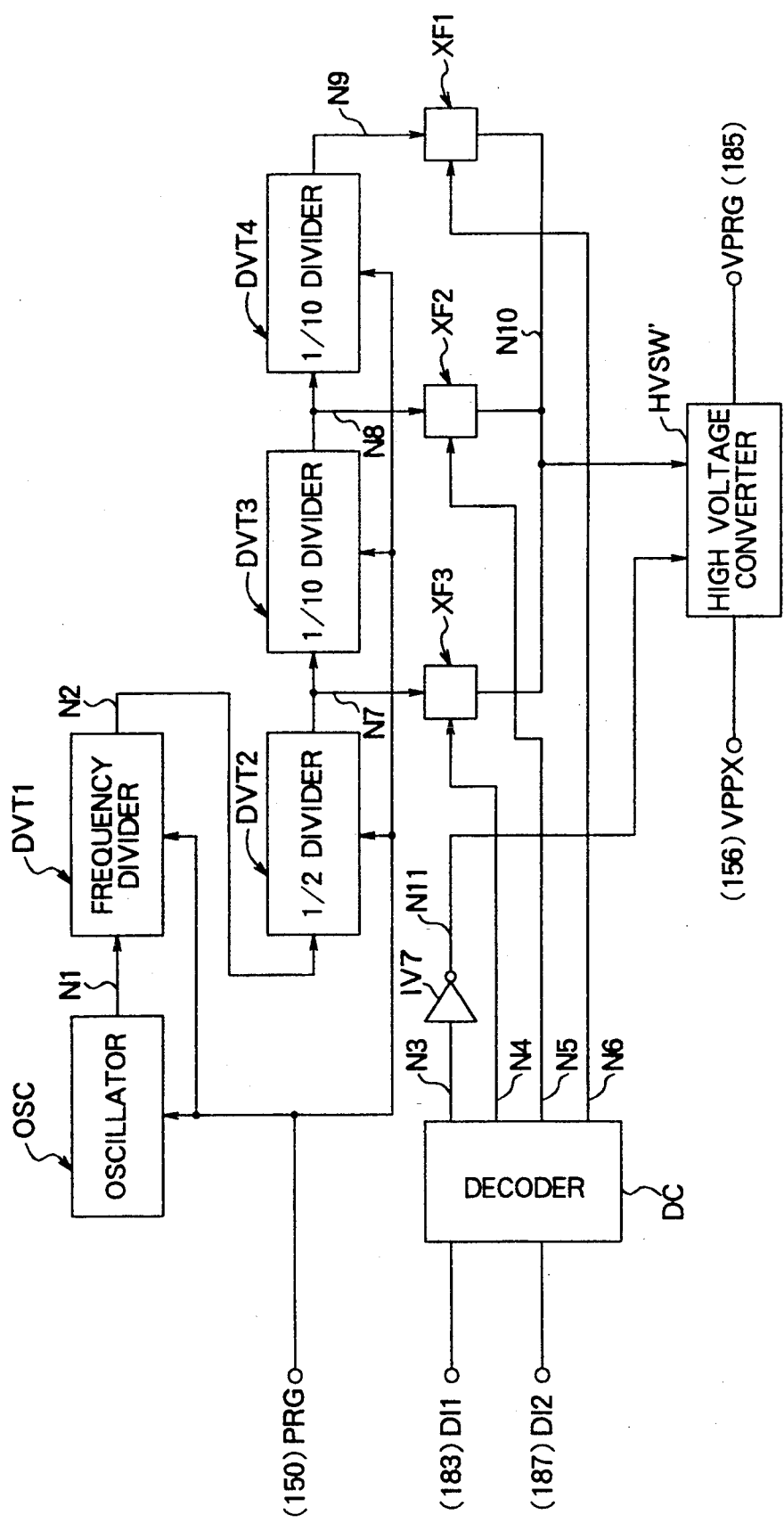
FIG. 4 is a detailed diagram of the program circuit of a second embodiment of the invention.

Referring to FIG. 4, there are shown a first data input terminal DI1, a second data input terminal DI2, a high voltage input terminal VPPX, a program enable signal input terminal PRG, and a program voltage output terminal VPRG. There are also shown an oscillator OSC of, for example, about one MHz, and frequency dividing circuits DVT1, DVT2, DVT3. The frequency dividing circuit DVT1 is formed of, for example, a series circuit of three 1/10-frequency dividers (i.e. a 1/1000-frequency divider), the frequency dividing circuit DVT2 is formed of, for example, a ½-frequency divider, and the frequency dividing circuit DVT3 is formed of, for example, 1/10-frequency divider. In addition, there are shown a frequency dividing circuit DVT4 which is formed of, for example, a 1/10-frequency divider, a high-voltage converter HVSW', a decoder circuit DC, an inverter circuit IV1 and transfer gates XF3, XF2, XF1.

In FIG. 4, the signal line N1 transmits the output from the oscillator OSC to the frequency divider DVT1. The signal line N2 transmits the output from the frequency divider DVT1 to the frequency divider DVT2. The signal line N7 transmits the output from the frequency divider DVT2 to the frequency divider DVT3 and transfer gate XF3. The signal line N8 transmits the output from the frequency divider DVT3 to the frequency divider DVT4 and transfer gate XF2. The signal line N9 transmits the output from the frequency divider DVT4 to the transfer gate XF1. The signal line N3 transmits the output from the decoder DC to the inverter circuit IV1. The signal line N4 transmits the output from the decoder circuit DC to the control input of the transfer gate XF3. The signal line N5 transmits the output from the decoder DC to the control input of the transfer gate XF2. The signal line N6 transmits the output from the decoder DC to the control input of the transfer gate XF1. The signal line N7 transmits the output from DVT2 to the transfer gate XF3. The signal line N11 transmits the output from the inverter circuit IV1 to the control input of the high-voltage conversion circuit HVSW'. The signal line N10 transmits the outputs from the transfer gates XF1, XF2 and XF3 to the high-voltage conversion circuit HVSW'. The program enable input terminal PRG is connected to the oscillator OSC, and dividers DVT1, DVT2, DVT3, DVT4 and high-voltage conversion circuit HVSW'. The first data input terminal DI1 and the second data input terminal DI2 are connected to the decoder DC, the output of the high-voltage input terminal VPPX is connected to the high-voltage conversion circuit HVSW', and the program voltage output terminal VPRG is connected to the output of the high-voltage conversion circuit HVSW'.

In FIG. 4, the data input terminal DI1 is connected to the signal line 183 shown in FIG. 1, the second input terminal DI2 to the signal line 187 shown in FIG. 1, the high-voltage input terminal VPPX to the signal line 156 shown in FIG. 1, the program enable signal input terminal PRG to the signal line 150 shown in FIG. 1, and the program voltage output terminal VPRG to the signal line 185 shown in FIG. 1.

The operation of the arrangement shown in FIG. 4 will be described with reference to the timing chart of FIG. 5.

Figure 5:
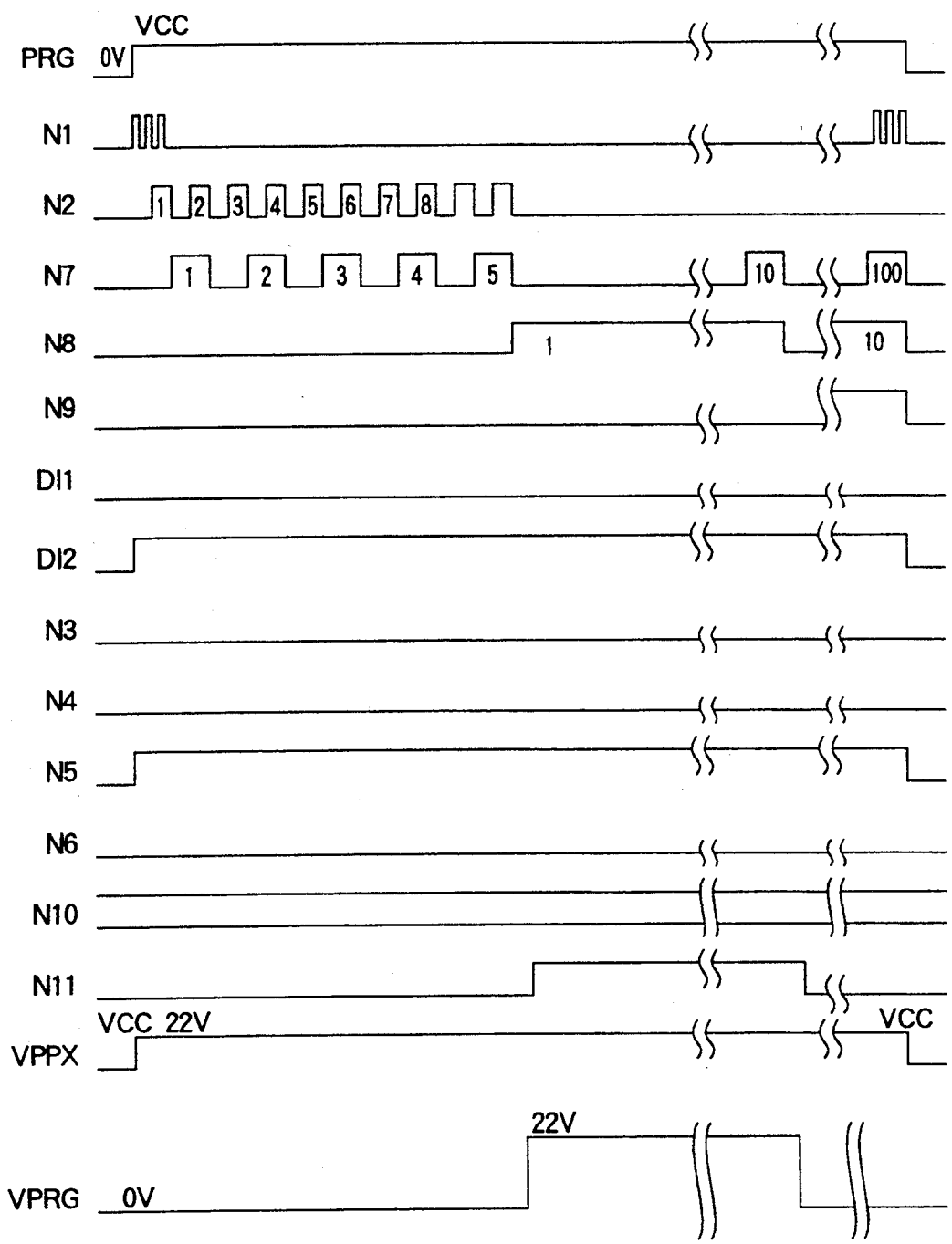
FIG. 5 is a timing chart useful for explaining the second embodiment of the invention.

In FIG. 5, voltage waveforms at respective nodes are shown in a time series, in a case that a low voltage is applied to the first data input terminal DI1 and a high voltage is applied to the second data input terminal DI2. First, the enable signal is supplied through the program enable signal input terminal PRG to all circuits except for the decoder DC. When the enable signal is changed from the low voltage to the high voltage, the oscillator OSC starts oscillating, and the frequency dividers DVT1, DVT2, DVT3, DVT4 start their frequency dividing operations, so that the high-voltage conversion circuit HVSW' is activated. When the high voltage is applied to the program enable signal input terminal PRG, data is supplied to the first data input terminal DI1 and the second data input terminal DI2, and the voltage at the high-voltage input terminal VPPX is changed from the source voltage to a high voltage (for example, 22 V). If one cycle of the signal on the signal line N1 is assumed to be one microsecond, the frequency is divided by one thousand at the frequency divider DVT1, so that the divider produces a signal of which one cycle is one millisecond. The decoder DC decodes the data at the first and second data input terminals DI1 and DI2, so that the signal lines N3, N5, N4 and N6 are at a low voltage, high voltage, low voltage and low voltage, respectively. The frequency dividers DVT1, DVT2, DVT3, DVT4 are each formed of, for example, a D-type flip-flop having a reset function of the trailing-edge triggering type in synchronizing clock operation. The signal lines N1, N2, N7, N8 are connected to the clock terminals of the frequency dividers DVT1, DVT2, DVT3, DVT4, respectively. Since the signal line N5 is at the high voltage, and since the signal lines N3, N4, N6 are at the low voltage, the signal line N11 is at the high voltage, and the transfer gates XF3, XF1 are nonconductive. In addition, the transfer gate XF2 is conductive, and the signal line N8 is electrically connected to the signal line N10. When the pulse width of the signal on the signal line N2 is, for example, 0.5 millisecond, the pulse width of the output from each frequency divider is such that the width of the signal on the signal line N7 is one millisecond, the width of the signal on the signal line N8 is 10 milliseconds, and the width of the signal on the signal line N9 is 100 milliseconds. One of these pulses on the respective signal lines is selected and fed to the high-voltage conversion circuit HVSW' in accordance with the data fed to the first and second data input terminals DI1 and DI2. When the signal line N3 is at the high voltage, the high-voltage conversion circuit HVSW' is rendered inactive, and produces no program pulse. The high-voltage conversion circuit HVSW' converts the voltage on the signal line N10 into a high voltage. When both the program enable signal input terminal PRG and the signal line N3 are at the high voltage, the voltage value at the high-voltage input terminal VPPX is produced at the program voltage output terminal VPRG. Therefore, according to the operation mentioned above, when the first data input terminal DI1 and the second data input terminal DI2 are low and high, respectively, a pulse having a width of 100 milliseconds and a height of, for example, 22 V is produced at the program voltage output terminal VPRG. When other data is supplied to the first and second data input terminals DI1, DI2, a similar operation is also performed to produce the program pulse width corresponding to the data.

The width, or duration time of the program pulse is not necessary to be fixed. While in this embodiment each input data is in direct proportion to the logarithm of the pulse width, this relation does not necessary have to be satisfied, provided that the input data satisfies a relationship in magnitude with respect to the threshold values of the memory cells or the reference memory cells as mentioned hereafter.

The third embodiment of the invention will be described with reference to FIGS. 6 and 7. While in the first embodiment at least four signals of different voltages are generated and stored in memory cells in the program mode, in the third embodiment at least four different program voltage pulse trains are produced and stored in memory cells.

In the third embodiment, only the program circuit 120" is different from that shown in FIG. 1, and the other elements are the same as those in the first embodiment. The program circuit 120" of the third embodiment will be described with reference to FIG. 6.

Figure 6:
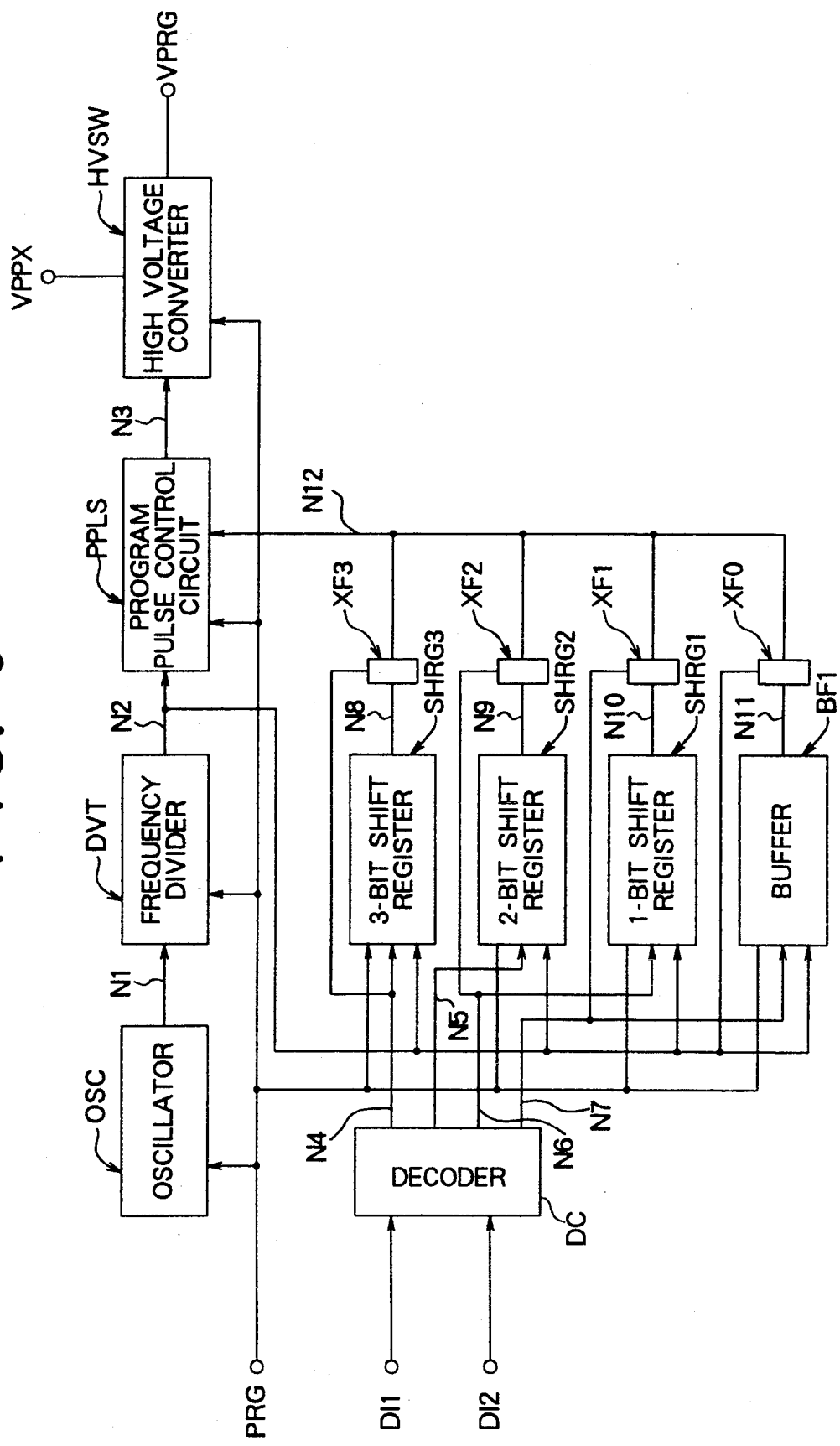
FIG. 6 is a detailed diagram of the program circuit of a third embodiment of the invention.
Figure 7:
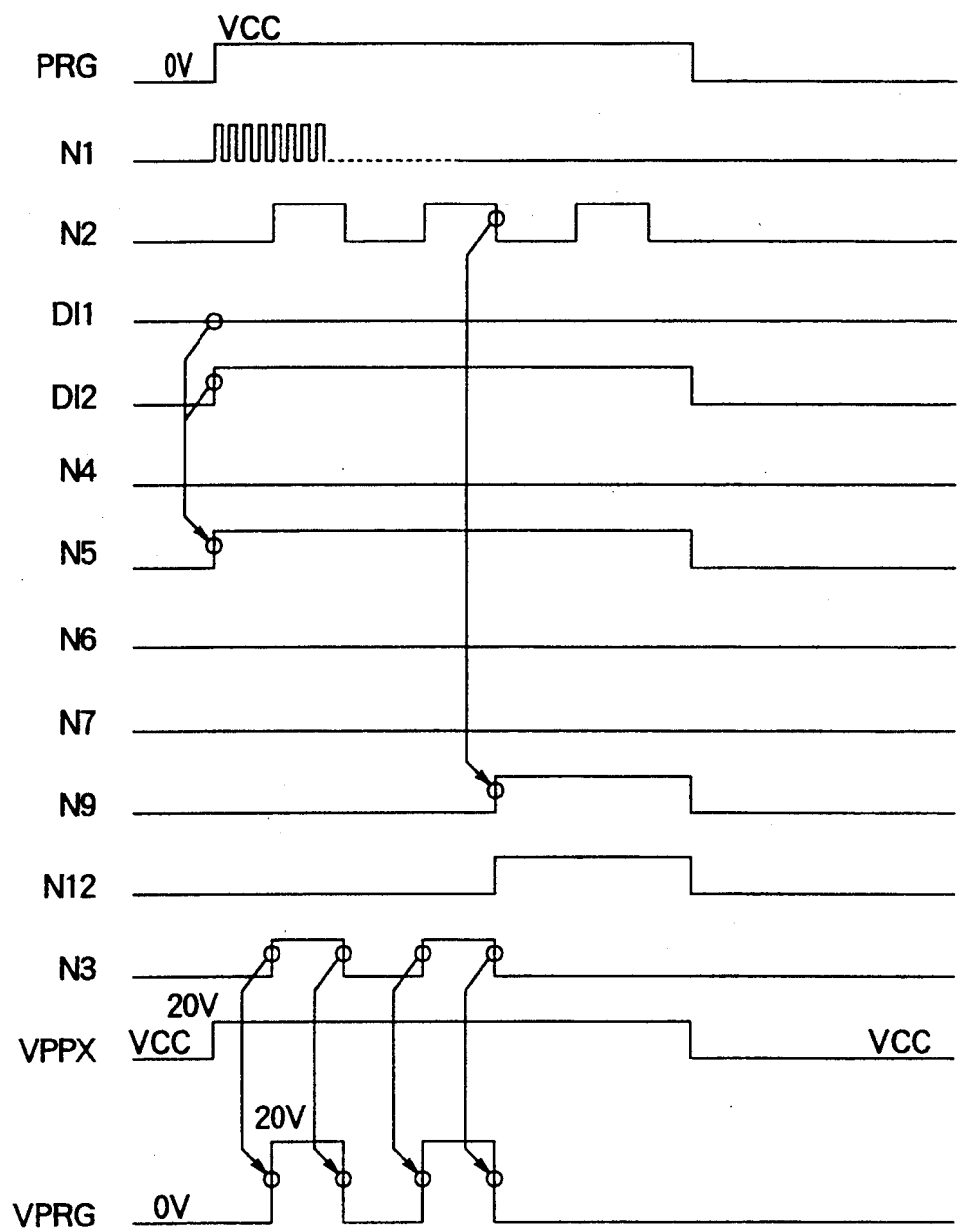
FIG. 7 is a timing chart useful for explaining the third embodiment of the invention.

FIG. 6 shows in detail the program circuit 120" corresponding to the program circuit shown in FIG. 1. Referring to FIG. 6, there are shown a first data input terminal DI1, a second data input terminal DI2, a high-voltage input terminal VPPX, a program enable signal input terminal PRG, and a program voltage output terminal VPRG. Also, there are shown an oscillator OSC which oscillates at, for example, about one MHz, a frequency dividing circuit DVT which is formed of, for example, a series circuit of three 1/10-frequency dividers (i.e. a 1/1000-frequency divider), and a pulse count control circuit PPLS for controlling the pulse number of the program pulse signal. In addition, there are shown a high-voltage conversion circuit HVSW', a decoder circuit DC, a three-bit shift register SHRG3, a two-bit shift register SHRG2, a one-bit shift register SHRG1, a buffer circuit BF1, and transfer gates XF3, XF2, XF1 and XF0.

In FIG. 6, the signal line N1 connects the output terminal of the oscillator OSC to the input terminal of the frequency divider DVT. The signal line N2 connects the output terminal of the frequency divider DVT to the input terminals of the pulse count control circuit PPLS, shift registers SHRG3, SHRG2, SHRG1 and buffer circuit BF1. The signal line N3 connects the output terminal of the pulse count control circuit PPLS with the input terminal of the high-voltage conversion circuit HVSW'. The signal line N4 connects the output terminal of the decoder DC and the input terminals of the shift register SHRG3 and transfer gate XF3 with each other. The signal line N5 connects the output terminal of the decoder DC to the input terminals of the shift register SHRG2 and transfer gate XF2. The signal line N6 connects the output terminal of the decoder DC to the input terminals of the shift register SHRG1 and transfer gate XF1. The signal line N7 connects the output terminal of the decoder DC to the input terminals of the buffer circuit BF1 and transfer gate XF0. The signal line N8 connects the output terminal of the shift register SHRG3 to the input terminal of the transfer gate XF3. The signal line N9 connects the output terminal of the shift register SHRG2 to the input terminal of the transfer gate XF2. The signal line N10 connects the output terminal of the shift register SHRG1 to the input terminal of the transfer gate XF1. The signal line N11 connects the output terminal of the buffer circuit BF1 to the input terminal of the transfer gate XF0. The signal line N12 connects the output terminals of the transfer gates XF0, XF1, XF2, XF3 to the input terminal of the pulse count control circuit PPLS.

The signal at the program enable signal input terminal PRG is supplied to the oscillator OSC, frequency divider DVT, pulse count control circuit PPLS, high-voltage conversion circuit HVSW', shift registers SHRG3, SHRG2, SHRG1 and buffer circuit BF1. The input signals at the first and second data input terminals DI1, DI2 are supplied to the decoder DC. The input signal at the high-voltage input terminal VPPX is fed to the high-voltage conversion circuit HVSW', and the output signal at the program voltage output terminal VPRG is produced from the high-voltage conversion circuit HVSW'. In FIG. 6, the first data input terminal DI1 is connected to the signal line 183 shown in FIG. 1, the second data input terminal DI2 is connected to the signal line 187 shown in FIG. 1, the high-voltage input terminal VPPX is connected to the signal line 156 shown in FIG. 1, the program enable signal input terminal PRG is connected to the signal line 150 shown in FIG. 1, and the program voltage output terminal VPRG is connected to the signal line 185 shown in FIG. 1.

The operation will be described with reference to the timing chart of FIG. 7. In FIG. 7, voltage wave forms at respective nodes are shown in time series, and it is shown that the first data input terminal DI1 and the second data input terminal DI2 respectively receive a low voltage and a high voltage. First, the enable signal is supplied through the program enable signal input terminal PRG to all circuits except for the decoder DC. When the enable signal is changed from the low voltage to the high voltage, the oscillator OSC starts oscillating, and the frequency divider DVT starts its frequency dividing operation, so that the pulse count control circuit PPLS and the high-voltage conversion circuit HVSW' are activated and that the shift registers (SHRG3, SHRG2, SHRG1) are released from reset. When the high voltage is applied to the program enable signal input terminal PRG, data is supplied to the first data input terminal DI1 and the second data input terminal DI2, and the voltage at the high-voltage input terminal VPPX is changed from the source voltage to a high voltage (for example, 22 V).

If one cycle of the signal on the signal line N1 is assumed to be one microsecond, the frequency is divided by one thousand at the frequency divider DVT, so that the divider produces on the signal line N2 a signal, one cycle of which is one millisecond.

The decoder DC decodes the data at the first and second data input terminals DI1 and DI2, so that the signal lines N4, N5, N6 and N7 are at a low voltage, high voltage, low voltage and low voltage, respectively. The signals on the signal lines N4, N5, N6 are supplied to the inputs of the shift registers SHRG3, SHRG2, SHRG1. The shift registers SHRG1 through SHRG3 are each formed of, for example, a D-type flip-flop having a reset function of the trailing-edge triggering type in synchronizing clock operation. The frequency divider DVT is also formed of a D-type flip-flop. The signal line N2 is connected to the clock terminals of the shift registers SHRG1 through SHRG3. Since the signal line N5 is at the high voltage, and the signal lines N4, N6, N7 are at the low voltage, the signal lines N8, N10, N11 remain low even though the clock is fed to the signal line N2. The signal line N9 is rendered to the high voltage at ending of the two clock pulses on the signal line N2. The transfer gates XF3, XF1, XF0 are nonconductive since the signal lines N8, N10, N11 are low. The transfer gate XF2 is conductive since the signal line N5 is high. The signal line N9 is electrically connected to the signal line N12.

The signal on the signal line N12 is supplied to the reset terminal of the pulse count control circuit PPLS. The program count control circuit buffers the input signal on the signal line N2 until the reset signal appears. Therefore, two decoded clock pulses from input data are produced on the signal line N3. The high-voltage conversion circuit HVSW' converts the voltage on the signal line N3 into a high voltage. When both the program enable signal input terminal PRG and the signal line N3 are high voltages, the voltage value at the high-voltage input terminal VPPX is produced at the program voltage output terminal VPRG. Therefore, according to the operation mentioned above, when the first and second data input terminals DI1 and DI2 are respectively at the low and high voltages, two pulses each of which has a width of 0.5 millisecond and a height of, for example, 20 V are produced at the program voltage output terminal VPRG. When other data are supplied to the first and second data input terminals DI1 and DI2, the similar operation is performed to produce program pulses the number of which is determined by the data value.

The number of program pulses does not necessarily have to be fixed, but may be a larger number (for example, 0 pulse for (1 1), 10 pulses for (1 0), 20 pulses for (0 1), 30 pulses for (0 0)). In this case, the width of each program pulse has to be reduced. In addition, while in this embodiment the number of pulses is in direct proportion to the input data, this relation is not necessary to be satisfied provided that the threshold values of the memory cells or the reference memory cells, as described later, satisfy a given or relationship in magnitude with the input data.

The fourth embodiment of the invention will be described with reference to FIG. 8. This embodiment is an expanded modification of the first, second and third embodiments, or a memory of $2^n$ bits×m structure. In this embodiment, one memory cell for simplicity is able to store four different values. A memory of n=2 will be described below.

Figure 8:
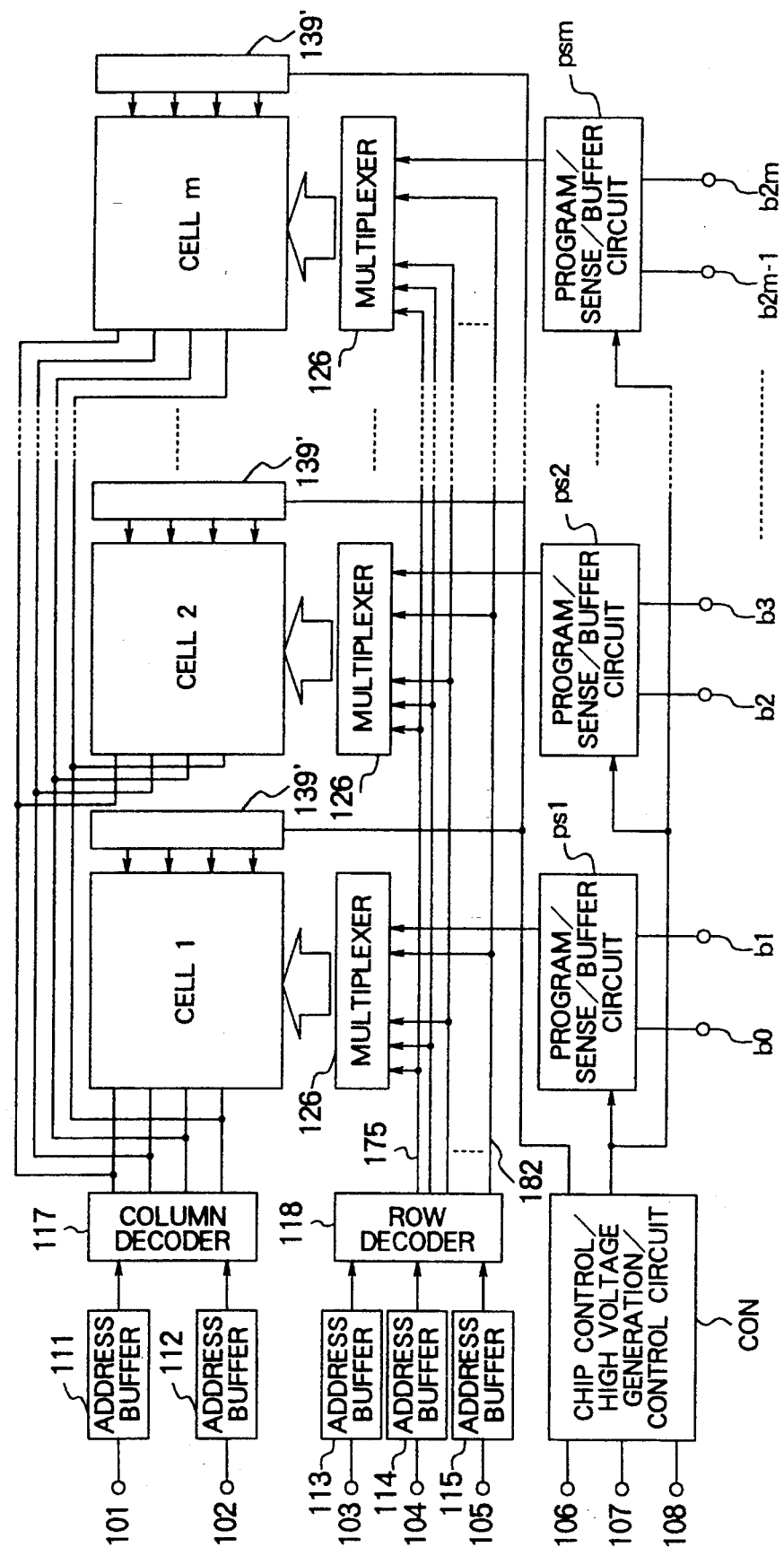
FIG. 8 is a block diagram of a fourth embodiment of the invention.

FIG. 8 shows the memory of this embodiment. Referring to FIG. 8, there are shown blocks CELL1 through CELLm which have the same memory cells 243, 244 ... 274. The address buffers 111, 112, ..., 115, the row decoder 118, the column decoder 117 and the multiplexer 126 are the same as those represented by like reference numerals in FIG. 1. In FIG. 8, the block con includes the chip control circuit 116 and high-voltage generation/control circuit 119 shown in FIG. 1. Also, in FIG. 8, the blocks, ps1, ps2, ..., psm each include the program circuit 120, sense circuit 123, data input buffers 121, 124 and data output buffers 122, 125 shown in FIG. 1, and are hereinafter called the program blocks. The construction and operation of the program circuit 120 in each program block are the same as those of the program circuit 120 shown in the first, second and third embodiments.

The input terminals b0 and b1 of the program block ps1 are respectively connected to the LSB and the second bit of the data bus which has a bus width of 2m bits. The input terminals b0 and b1 correspond to the data input/output terminals 109 and 110 shown in FIG. 1, respectively. Similarly, the input terminals b2 and b3 of the program block ps2 are connected to the third bit and the fourth bit of the 2m bit data bus. The input terminals b2m−1 and b2m of the program block psm are connected to the (2m−1)th bit and MSB of the 2m bit data bus, respectively. Each two bits of the 2m bit data bus shows 2n, or four different values of data. Therefore, by using each two bits of the 2m bit data bus, it is possible to transmit m different data each having four different values to the program blocks ps1, ps2, ..., psm. The program blocks ps1, ps2, ..., psm, respectively, each supply four different values of received data to the memory cells CELL1, CELL2, ..., CELLm to be stored at a certain address. The way to store is the same as mentioned in the third embodiment. Therefore, a large number of data can be effectively transmitted to a four-value memory.

The fifth embodiment of the invention will be described with reference to FIGS. 9 through 11. In the fifth embodiment, a selected one of eight data (001), (000), (010), (011), (111), (101), (100), (110), each represented by three bits, is written in each memory. Eight different high voltage values to be applied to the gate of the memory cell are provided correspondingly to the eight different data. By these program high voltage values, the threshold voltage of each memory cell is set at one of eight levels corresponding to the eight different data. When the program voltages of 22 V, 20 V, .. . correspond to the input data of (001), (000), ..., respectively, the threshold voltage of the memory cell is set at −1.5 V, −0.5 V, ... with the program voltage of 22 V, 20 V, ..., respectively, since the threshold voltage is proportional to the program voltage. The circuit arrangement will be described below.

Figure 10:
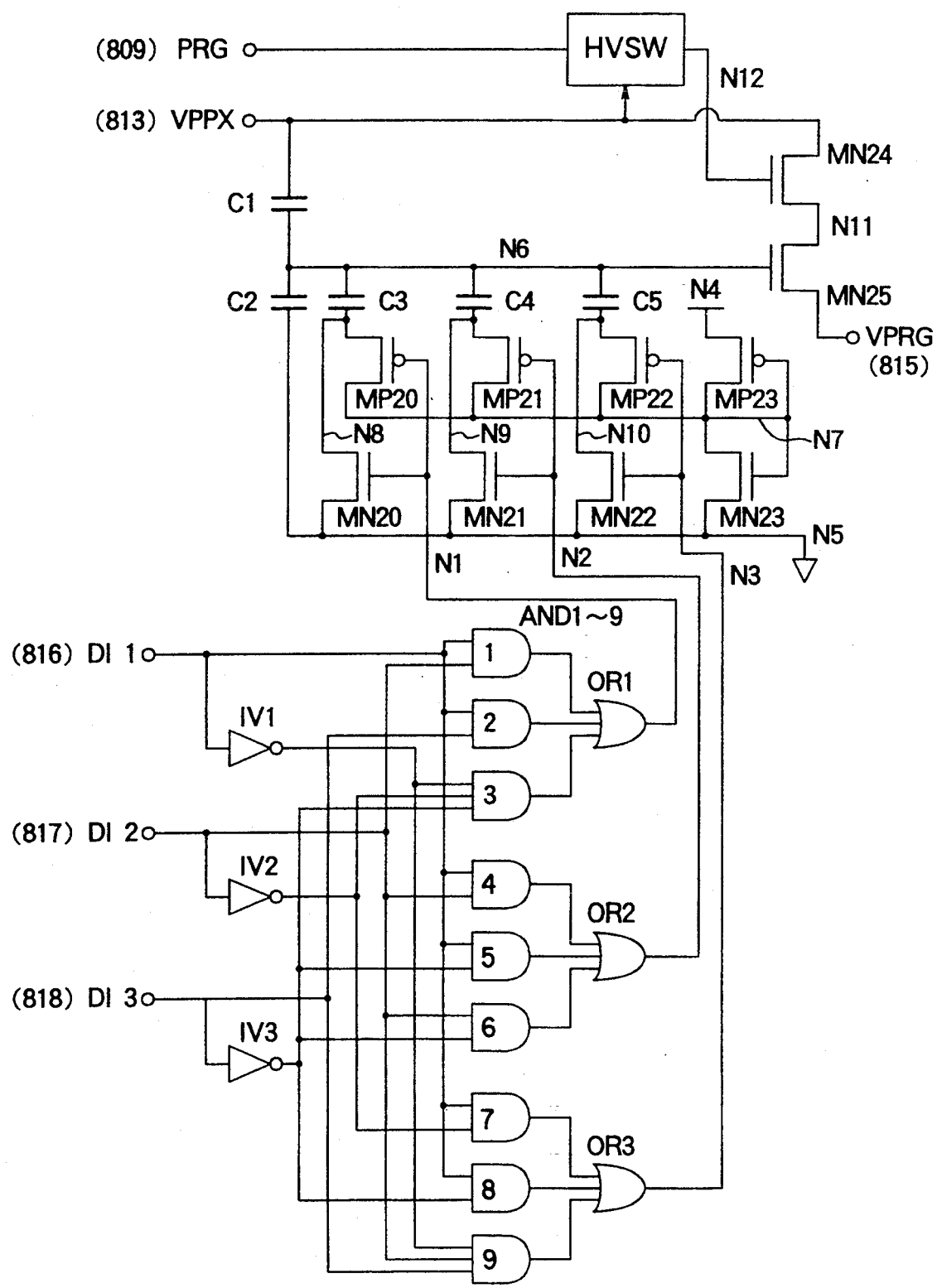
FIG. 10 is a detailed circuit diagram of the program circuit shown in FIG. 9.
Figure 11:
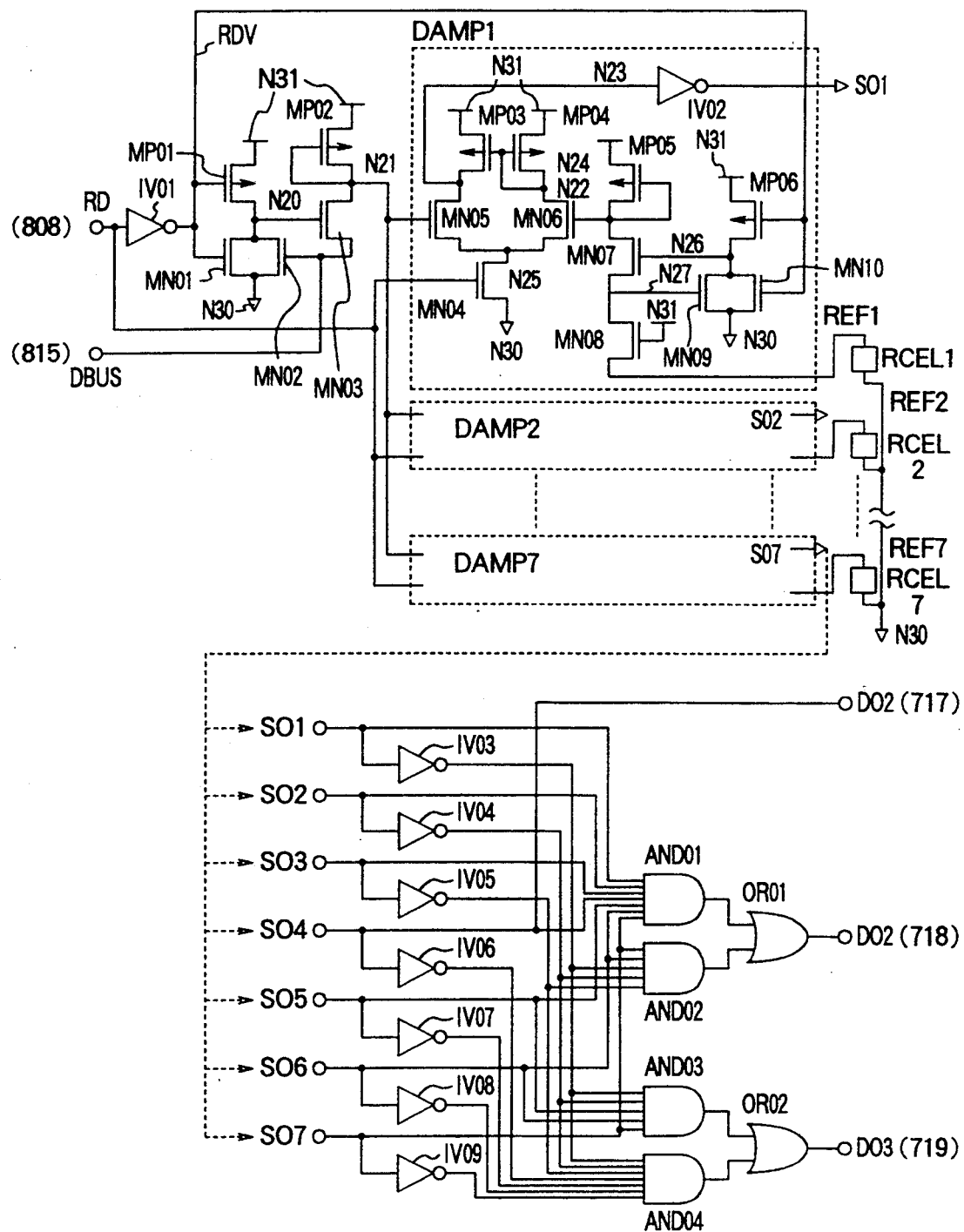
FIG. 11 is a detailed circuit diagram of the sense circuit shown in FIG. 9.

FIG. 9 shows the EEPROM of this embodiment, FIG. 10 shows the program circuit of FIG. 9, and FIG. 11 shows the sense circuit of FIG. 9. In FIG. 9, there are shown address input terminals 701 through 706, control input terminals 707 through 709, data input/output terminals 711 through 719, address buffers 720 through 725, a chip control circuit 726, a high voltage generation/control circuit 727, a column decoder 728, a row decoder 729, memory cells 747 through 762, memory cell arrays MARY01 through MARY03, each including memory cells in four rows and four columns, and memory array groups MARY1 through MARY3, each including three memory arrays MARY01 through MARY03. There are also shown memory sense program line selection circuits 743 through 746, multiplexers 731 through 733, a program circuit 741, a sense circuit 742, data input buffers 734 through 736, data output buffers 737 through 739, and circuit blocks each of which is formed of the program circuit, the sense circuit, the three data input buffers and the three data output buffers. The memory cell is the same as the conventional one, or has one select transistor and one memory transistor, and this memory transistor injects electric charge into the floating gate through a thin insulating film. The configuration of the memory cell is not limited to a particular one.

In FIG. 9, a line 801 connects the output of the address buffer 720 to the input of the column decoder 728, a line 802 connects the output of the address buffer 721 to the input of the column decoder 728, a line 803 connects the output of the address buffer 722 to the input of the row decoder 729, a line 804 connects the output of the address buffer 723 to the input of the row decoder 729, a line 805 connects the output of the address buffer 724 to the input of the row decoder 729, and a line 806 connects the output of the address buffer 725 to the input of the row decoder 729.

Lines 822 through 825 are column lines (word lines) which connect the selection gates of each memory cell array MARY01 through MARY03 and the memory sense program line selection circuits 743 through 746 to the column decoder 728. Lines 826 through 837 connect the outputs of the row decoder 729 to the inputs of the multiplexers 731 through 733. Lines 846 through 881 are row lines (bit lines) which connect the drains of the each memory cell array MARY01 through MARY03 to the multiplexers 731 through 733.

Shown as 807 is a power down signal which is produced by the chip control circuit 726 and applied to the inputs of the address buffers 720 through 725. Shown as 808 is a read enable signal which is produced by the chip control circuit 726 and applied to the sense circuits of the circuit blocks D701 through D703. Shown as 809 is a program enable signal which is produced by the chip control circuit 726 and applied to the program circuit in each of the circuit blocks D701 through D703 and to the input of the high voltage generation/control circuit 727. Shown as 810 is an erase signal which is produced by the chip control circuit 726 and applied to the input of the high voltage generation/control circuit 727. Reference numeral 811 is a data input enable signal which is produced by the chip control circuit 726 and applied to the data input buffer in each of the circuit blocks D701 through D703. Shown as 812 is a data output enable signal which is produced by the chip control circuit 726 and applied to the data output buffer in each of the circuit blocks D701 through D703.

Reference numerals 815, 844 and 845 are data lines which connect the input/out puts of the multiplexers 731 through 733 to the input/outputs of the circuit blocks D701 through D703, respectively. In the circuit block D701, lines 816 through 818 connect the outputs of the data input buffers 734 through 738 to the input of the program circuit 741, lines 819 through 821 connect the output of the sense circuit 742 to the inputs of the data output buffers 737 through 739.

Shown as 838 is a high voltage line which connects the first high voltage of the output of the high voltage generation/control circuit 727 to the inputs of the column decoder 728 and row decoder 729. 814 is a memory sense voltage line which connects the memory sense voltage of the output of the high voltage generation/control circuit 727 to the inputs of the memory sense program line selection circuits 743 through 746. 813 is a program high voltage line and connects a second high voltage of the output of the high voltage generation/control circuit 727 to the input of each program circuit of the circuit blocks D701 through D703. 839 is a memory ground line and connects the ground terminal of the high voltage generation/control circuit 727 to the source terminals of each memory cell array MARY1 through MARY3. The address input terminals 701 through 706 are connected to the inputs of the address buffers 720 through 725, the control input terminals 707 through 709 are connected to the input of the chip control circuit 726, the data input/output terminals 717 through 719 are connected to the inputs of the data input buffers 734 through 736 and to the outputs of the data output buffers 737 through 739 of the circuit block D701, the data input/output terminals 714 through 716 are connected to the data input buffers and data output buffers of the circuit block D702, and the data input/output terminals 711 through 713 are connected to the data input buffers and data output buffers of the circuit block D703.

The EEPROM of FIG. 9 is able to operate at least the read mode, write mode, power down mode (or standby mode), and output non-selection mode. The write mode is divided into the erase mode and the program mode.

When the EEPROM operates in the read mode, the inputs to the control input terminals 707 through 709 are first set to the read mode, and then an address to be read is supplied to the address input terminals 701 through 706. The input address is buffered by the address buffers 720 through 725. The outputs of the two address buffers 720, 721 are decoded by the column decoder 128 into a high voltage on a selected one of four column lines 822 through 825 and low voltages on the other three lines. The outputs of the four address buffers 722 through 725 are decoded by the row decoder 729 into values on 12 row lines 826 through 837. A selected one of the 12 row lines is made conductive to the data lines 815, 844 and 845 by the multiplexers 731 through 733, respectively. When the column and row lines are decoded, one of the memory cells of each memory array is selected, for example, a memory cell 750 at the intersection of 722 and 846, and memory cells in the memory cell arrays MARY2, MARY3 corresponding in position to the memory cell 750 in the memory cell array MARY1 are selected.

The high voltage generation/control circuit 727 and each program circuit and data input buffer of the circuit blocks D701 through D703 are inactivated by the control signals 807 through 812. As a result, the line 838 is kept at, for example, about the power supply voltage, the line 814 is at, for example, 3 V, the line 813 is at, for example, the low voltage, the line 839 is at ground potential, and the output of each data input buffer, or the input of each program circuit of the circuit blocks D701 through D703 is at the low voltage. Since the line 808 from the chip control circuit 726 is at, for example, the high voltage, the sense circuit in each of the circuit blocks D701 through D703 is activated to effect to the row-line voltage produced on the data-line amplification, detection by comparison and decoding thereby producing an output applied to each data output buffer. The data output buffers buffer the outputs from the sense circuit and produce the recorded data of the memory cells at the data input/output terminals 711 through 719.

In the erase mode, the erase mode is established by the control input terminals 707 through 709, and the column address to be erased is supplied to the address input terminals 701, 702. The output signal produced on the line 807 from the chip control circuit 726 becomes, for example, the low voltage, the signal on the line 810 is at the high voltage, the signal on the line 811 is at the low voltage, and the signal on the line 812 is at the low voltage. The high voltage generation/control circuit 727 is activated, and the program circuit, sense circuit and data output buffers in each of the circuit blocks D701 through D703 are inactivated. The high voltage generation/control circuit 727 generates at the output 838 a high voltage (for example, 20 V), at the output 814 a high voltage (for example, 20 V), at the output 813 a low voltage or around the power supply voltage and at the output 839 the ground potential. As a result, one (for example, 822) of the outputs 822 through 825 of the column decoder 728 is at the high voltage (for example, 20 V). One (for example, 840) of the memory sense program lines 840 through 843 is at the high voltage (for example, 20 V). Therefore, the gate of each of the memory cell transistors disposed on the selected column line, each having the floating gate, is at 20 V, the source thereof is at ground potential, and the drain thereof is at ground potential (since the memory cell transistor is made conductive by the gate voltage), so that Fowler-Nordheim tunnel phenomenon occurs thereby increasing the threshold voltage thereof as high as, for example, 4 V.

In the program mode, the program mode is first established by the control input terminals 707 through 709, and then the address for program is supplied to the address input terminals 701 through 706. The output signals on lines 807 and 808 from the chip control circuit 726 are at, for example, low voltage, the signal on the line 809 is at the high voltage, the signal on the line 810 is at the low voltage, the signal on the line 811 is at the high voltage, and the signal on the line 812 is at the low voltage. The high voltage generation/control circuit 727 and the program circuit and data input buffers in each of the circuit blocks D701 through D703 are activated, and the sense circuit and data output buffers in each of the circuit blocks D701 through D703 are inactivated. The output 838 of the high voltage generation/control circuit 727 is at the high voltage (for example, 23 V), the output 814 thereof is at the ground potential, the output 813 is at the high voltage (for example, 23 V), and the output 839 provides a high impedance. As a result, one (for example, 822) of the outputs 822 through 825 of the column decoder 728 is at the high voltage (for example, 23 V), and one of the outputs 826 through 837 of the row decoder 729 is at the high voltage (for example, 23 V). Thereby connecting, the corresponding row line to the data line 815.

In the program mode, the input data, which is supplied through the data input/output terminals 711 through 719 substantially at the same time as input of the address, is buffered by the data input buffers and fed to the program circuit. In the program circuit, the input data is converted into the program voltage and a predetermined program voltage corresponding to the input data is produced on the data line, for example, 815. In this embodiment, the program voltage is a selected one of eight different voltage values (for example, 22 V, 21 V, 20 V, ..., 15 V). The program voltage value may be one of four or eight or more. When column line 822 and row line 846 are selected, for example, the signal on the row line 846 is rendered to the program voltage (for example, 20 V) through the multiplexer 731. Since the line 814 is at ground potential and line 822 is at 23 V, the memory sense program line 840 is grounded through the memory sense program line selection circuit 743. Thus, a voltage of 20 V is applied to the drain of the memory cell 750, and the ground potential is applied to its gate, so that contrary to the erase mode, the threshold value of the memory cell is decreased to, for example, −0.5 V. The threshold value of the memory cell is changed in proportion to the program voltage value.

While in this embodiment only the input to the control input terminals 707 through 709 is used for setting one of the erase mode, program mode, and other modes, this invention is not limited to this way. In addition, memory cells on one column line are erased in the erase mode, memory cells of one byte or one block may be erased.

FIG. 10 is a detailed circuit diagram of the program circuit of FIG. 9. In FIG. 10, there are shown a first data input DI1, a second data input DI2, a third data input DI3, a high voltage input VPPX, a program enable signal input PRG, and a program voltage output VPRG. There are also shown inverter circuits IV1 through IV3, a high voltage switch HVSW, capacitances C1 through C5, N-channel enhancement MOS transistors MN20 through MN25, and P-channel enhancement MOS transistors MP20 through MP23. There are shown two-input or three-input logic product circuits (AND circuits) AND1 through AND9 formed of MOS transistors, and three-input logic sum circuits (OR circuits) OR1 through OR3 formed of MOS transistors.

The output N1 of the OR circuit OR1 is connected to the gates of the transistors MP20 and MN20. The output N2 of the OR circuit OR2 is connected to the gates of the transistors MP21 and MN21. The output N3 of the OR circuit OR3 is connected to the gates of the transistors MP22 and MN22. The ground node N5 is connected to the ground potential point of the inverter circuit, to one end of the capacitance C2 and to the sources of the transistors MN20 through MN23. A line N7 is connected to the drains of the transistors MN23 and MP20 through MP23 and to the gates of the transistors MP23 and MN23. A line N8 is connected to one end of the capacitance C3, to the source of the transistor MP20 and to the drain of the transistor MN20. A line N9 is connected to one end of the capacitance C4, to the source of the transistor MP21 and to the drain of the transistor MN21. A line N10 is connected to one end of the capacitance C5, to the source of the transistor MP22 and to the drain of the transistor MN22. A line N6 is connected to one end of the capacitance C1, to the other end of each of the capacitances C2 through C5 and to the gate of the transistor MN25. A line N11 is connected to the source of the transistor MN24 and to the drain of the transistor MN25. The output N12 of the high voltage switch HVSW is connected to the gate of the transistor MN24. A power supply node N4 is connected to the source of the transistor MP23 and to the power supply terminals of the inverter, AND circuits and OR circuits. The high voltage input VPPX is connected to the other end of the capacitance C1, to the drain of the transistor MN24 and to the input end of the high voltage switch HVSW. The program enable signal PRG is supplied to the control input end of the high voltage switch HVSW. The data inputs DI1 through DI3 are connected to the input ends of the inverter circuits IV1 through IV3 and of the AND circuit. The output ends of the AND circuits AND1 through AND9 are connected to the input ends of the OR circuits OR1 through OR3, and the program voltage VPRG is connected to the source of the transistor MN25.

In FIG. 10, the first data input DI1 corresponds to the input 816 in the circuit block D701 in FIG. 9. Further, the second data input DI2 to the input 817, the third data input DI3 to the input 818, the high voltage input VPPX to the input 813, the program enable signal PRG to the signal 809, and the program voltage VPRG to the signal 815 in the circuit block D701 in FIG. 9.

The program circuit shown in FIG. 10 is the circuit for converting three-bit digital data into analog data. When a high voltage (for example, 24 V) is applied to the high voltage input VPPX and the program enable signal PRG is at the high voltage, the voltage value on the line N6 is determined by the capacitances C1 through C5 and the voltage on the line N7 as follows.

The voltage on the line N6=(voltage of VPPX×value of C1+voltage at N8×value of C3+voltage at N9×value of C4+voltage at N10×value of C5)/CT where CT=C1+C2+C3+C4+C5

In this program circuit, when the voltages at N8, N9 and N10 are selectively switched between the ground potential and the voltage on the line N7 (for example, a low voltage of about 3 V) in accordance with the input data, the voltage value at N6 can be changed depending on the values of the inputs DI1, DI2, DI3. In addition, the voltage at N6 can be changed to eight different values in proportion to the input data by making the values of the capacitances C3, C4 and C5 different from each other (for example, C3<C4<C5).

When the voltage of the program enable signal PRG is high, the output N12 of the high voltage switch HVSW becomes a high voltage so that the transistor MN24 is turned on and the program voltage VPRG is equal to the voltage of N6 minus the threshold value of transistor MN25. When the voltage of N6 is 21 V, the program voltage VPRG becomes, for example, 20 V. In the embodiment of FIG. 10, when each of the first and second data inputs DI1 and DI2 is a high voltage and the third data input DI3 is a low voltage, the program voltage VPRG becomes the lowest (for example, 15 V). When each of the first and second data inputs DI1 and DI2 is a low voltage and the third data input DI3 is a high voltage, the program voltage VPRG is the highest (for example, 22 V). In addition, when the program enable signal PRG is a low voltage, the voltage of N12 is also a low voltage so that the transistor MN24 is turned off and that the program voltage VPRG is in the floating state.

FIG. 11 is a detailed circuit diagram of the sense circuit in FIG. 9. In FIG. 11, there are shown a read signal RD, a first data output DO1, a second data output DO2, a third data output DO3 and a memory read data input DBUS. There are shown inverter circuits IV01 through IV09 which are formed of MOS transistors, five-input and seven-input logic product circuits (AND circuits) AND01 through AND04 which are formed of MOS transistors, and two-input logic sum circuits (OR circuits) OR01 and OR02 which are formed of MOS transistors. There are also shown P-channel enhancement MOS transistors MP01 through MP06, N-channel enhancement MOS transistors MN01 through MN10 and reference memory cells RCEL1 through RCEL7.

A line N20 is connected to the drains of the transistors MP01, MN01, MN02, and to the gate of transistor MN03. A line N21 is connected to the drain and gate of the transistor MP02, to the drain of transistor MN03, and to the gate of transistor MN05. A line N23 is connected to the drain of transistor MP03, to the drain of transistor MN05 and to the input of inverter circuit IV02. A line N22 is connected to the drain and gate of transistor MP05, to the drain of transistor MN07 and to the gate of transistor MN06. A line N26 is connected to the gate of transistor MN06, to the drains of transistors MN09 and MN10 and to the gate of transistor MN07. A line N27 is connected to the source of transistor MP07, to the drain of transistor MP08 and to the gate of transistor MN09.

A circuit block DAMP1 includes the transistors MP03 through MN10 and inverter circuit IV02. Circuit blocks DAMP2 through DAMP7 have the same transistor arrangement and connections as DAMP1.

The read signal RD is supplied to the input end of the inverter circuit IV01 and to the gates of the transistors MN04 of DAMP1 through DAMP7. The output RDV of the inverter circuit IV01 is connected to the gates of the transistors MP01 and MN01 and to the gates of transistors MN06 and MN10 of DAMP1 through DAMP7.

The memory read data input DBUS is connected to the gate of transistor MN02 and the source of transistor MN03. The first data output DO1 is connected to an output SO1. The second data output DO2 is connected to the output of OR circuit OR01, and the third data output DO3 to the output of the OR circuit OR02. SO1 is an output of the inverter circuit IV02 of DAMP01 and an input to the inverter circuit IV03 and AND circuit. Similarly to SO1, SO2 through SO7 are the outputs of the respective inverter circuits IV02 of DAMP2 through DAMP7 and the inputs to the inverter circuits and AND circuits.

The outputs of the inverter circuits IV03 through IV09 are connected to the AND circuits, and the outputs of the AND circuits are connected to the OR circuits OR01 and OR02. A line REF1 is connected to the source of transistor MN08 of DAMP1 and the drain of reference memory cell RCEL1. Lines REF2 through REF7 are connected to the sources of transistors MN08 of DAMP2 through DAMP7 and the drains of reference memory cells RCEL2 through RCEL7, respectively.

A ground node N30 is connected to the ground nodes of the inverter circuits, AND circuits and OR circuits, the source terminals of transistors MN01, MN02, MN04, MN09, MN10 and the sources of reference memory cells RCEL1 through RCEL7. A power supply node N31 is connected to the power supply nodes of the inverter circuits, AND circuits and OR circuits, the sources of transistors MP01 through MP06 and the gate of transistor MN08.

The read signal RD in FIG. 11 corresponds to the output 808 in FIG. 9. Similarly, the memory read data input DBUS corresponds to the output or input 815 in, for example, D701, and the data outputs DO1, DO2, DO3 correspond to the outputs or inputs 717, 718, 719 of, for example, D701 in FIG. 9, respectively.

When the read mode is set the read signal RD becomes a high voltage, and the memory read data input DBUS is at the same potential as the row line of the selected memory cell. Since the output RDV from the inverter circuit IV01 is a low voltage, the transistor MP01 is turned on and the transistor MN01 is turned off, so that the voltage of N20 is increased above 0 V. When the voltage of N20 is increased, the transistor MN03 is turned on and the memory read data input DBUS becomes a voltage equal to the voltage of N20 minus the threshold value of transistor MN03. However, when the voltage of the memory read data input DBUS becomes higher than the threshold value of transistor MN02, the transistor MN02 is turned on, suppressing the potential of DBUS from increasing. Thus, when the read signal RD is a high voltage, the memory read data input DBUS becomes a voltage of about an intermediate value (for example, 2 V) between 0 V and the power supply voltage. At this time, if the memory cell to be read is at the on-state, a current flows from the memory read data input DBUS to the source of the memory cell, with the result that the potential of DBUS is slightly reduced (for example, to 1.8 V). Therefore, since the current is supplied through the transistor MP02, the voltage of N21 is greatly reduced (for example, from 4.2 V to 3.5 V), lower than that of the memory read data input DBUS by selecting the transistor MP02 of a proper size. In addition, since the voltage of N21 is proportional to the amount of current flowing through the memory cell, the circuit including the transistors MP01, MP02, MN02, MN03 amplifies the potential variation of the memory read data input DBUS. The transistors MP03, MP04, MN04, MN05, MN06 constitute a differential amplifier, and N21 and N22 are differential inputs thereto. The circuit including transistors MP05, MP06, MN07, MN09, MN10 is analogous to that of transistors MP01, MP02, MN01, MN02, MN03, and effects the same function on REF1 as that on DBUS.

When the threshold value of the memory cell to be read is for example 4 V, and the threshold values of reference memory cells RCEL1 through RCEL7 are for example 4.5 V, 3.5 V, 2.5 V, 1.5 V, 0.5 V, −0.5 V and −1.5 V, respectively, the voltages of REF1 through REF7 satisfy a relationship of REF7< . . . <voltage of REF2<voltage of DBUS<voltage of REF1 so that the output SO1 is at a low voltage, and each of the outputs SO2 through SO7 is at a high voltage. In this case, the threshold values of the reference memory cells are set beforehand in a test mode or the like and will not be described in detail in this embodiment. As a result, the output DO1 is at a high voltage and each of outputs DO2, DO3 is at a low voltage.

Thus, the information stored in the memory cell can be read out.

Figure 12:
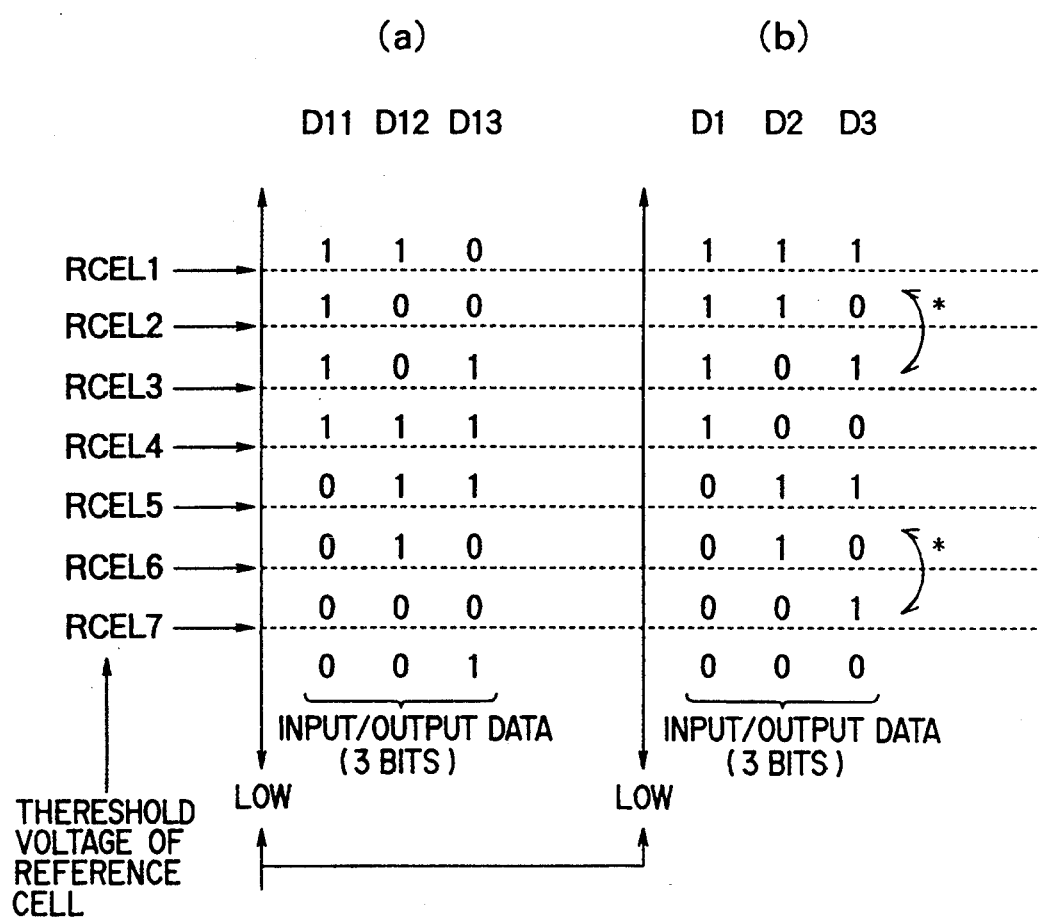
FIG. 12 is a diagram useful for explaining how to check error.

FIG. 12 shows a relationship between three-bit data (D1 through D3 or D11 through D13) which are read out or written through the input/output terminals (for example, 717 through 719 in the circuit block D701 in FIG. 9) and the threshold voltage of the memory cell in which the three-bit data is stored. This relationship shows that the threshold voltage becomes higher with change of the three-bit data upward and lower with the change thereof downward. The change of data by change of the threshold voltage of the memory cell and the detection of data error by parity will be described with reference to FIG. 12.

The program circuit and sense circuit in this embodiment are designed to meet the pattern of D11, D12, D13 (see FIG. 12(a)) in the relation between the input/output data and the threshold value of the memory cell. When the threshold value is shifted in level one step upward or downward, only one bit of D11, D12 and D13 is changed. Thus, if parity bit is added, it is possible to detect the presence or absence of error in data by which the threshold voltage of the memory cell is shifted in level one step upward or downward.

For example, in the EEPROM of FIG. 9 three memory arrays MARY01, MARY02, MARY03 are included in the memory array group MARY1, and each memory array has 12 memory cells connected in a matrix of four columns and four rows. It is now assumed that information is stored with one byte of 8 bits as a unit in the EEPROM. Thus, three memory cells having the same positional relation are respectively selected from the memory arrays MARY01, MARY02, MARY03 to form one memory cell group. For example, the memory cell 750, leftmost one in the top column of memory array MARY01, the memory cell, leftmost one in the top column of memory array MARY02, and the memory cell, leftmost one in the top column of memory array MARY03 are selected to form one memory group. Since each memory group has three memory cells, each of which can store information of three bits, information of 9 bits can be stored in each memory cell group. Therefore, if information of one byte is stored in one memory cell group, one bit is left free. This free bit is used as parity bit. Thus, any one bit of the nine bits of each memory cell group may be used as parity bit, but it is necessary for all memory cell groups to have the parity bits at the same positions. For example, the least significant bit (LSB) of data of three bits to be stored in the memory cell 750 of memory array MARY01, or the bit corresponding to D13 in FIG. 12(a) is selected as parity bit. In this parity bit, "0" is written when the number of bits "1" included in the eight bits of information to be stored in one memory cell group is even and "1" is written when it is odd. Thus, the number of bits "1" included in the composite information of 9 bits which is stored in one memory cell group and formed of the object information of 8 bits and one parity bit is always even.

Therefore, if the number of bits "1" in the composite information of 9 bits read out from one memory cell group is odd, it is decided that the read information includes error. In this case, it is most likely that the error occurring when data is written in or read from each memory cell is derived from error in level of threshold voltage set in each memory cell and the error is at the maximum corresponding to one step in change of the threshold voltage level. Consequently, if the relation between the data written in each memory and the set threshold voltage level is selected as in FIG. 12(a), the error caused when writing or reading of data will cause only one of 9 bits of the data to change, resulting in the number of bits "1" being odd. Thus, the error can be detected.

On the contrary, if the relation between the input data and threshold voltage is selected as in FIG. 12(b), two bits are sometimes changed with one-step change of threshold voltage level. Thus, the number of "1" bits still remains even and hence it is impossible to check if there is error.

Although in the above example the parity bit level is determined to make the number of bits "1" even, it is possible that the number of bits "1" is always odd or that the number of bits "0" is always even or odd. The parity check mentioned above is executed by the sense circuit shown in FIG. 9.

While in this embodiment the program voltage is changed in the program mode, the duration of the program voltage or the number of times that the program voltage is applied may be changed provided that the threshold value according to the input/output information can be provided in the memory cell.

While in this embodiment the reference memory cells are included in the sense circuit, they may be included in the memory cell array.

While in this embodiment eight threshold values are provided in the memory cells for convenience of explanation, more values may be provided.

While in this embodiment the function of the EEPROM is simplified for convenience of explanation, other functions may be added to this function in which case the effect of the invention is not lost. For example, the verify mode or the like after program can be added with ease.

While in this embodiment the memory cell includes the-transistor with the floating gate and the select transistor, it is not limiting as long as the threshold value of the memory cell can be changed in proportion to the program voltage in the program mode (see the memory cell described in documents 4 and 5).

While in the semiconductor memory device of this embodiment one-bit parity is provided for one byte (8 bits), the number of parity bits relative to data may be smaller or larger than that.

While in this embodiment data and parity bit are stored together in one memory cell, data and parity bit may be separately stored in different memory cells.

Figure 13:
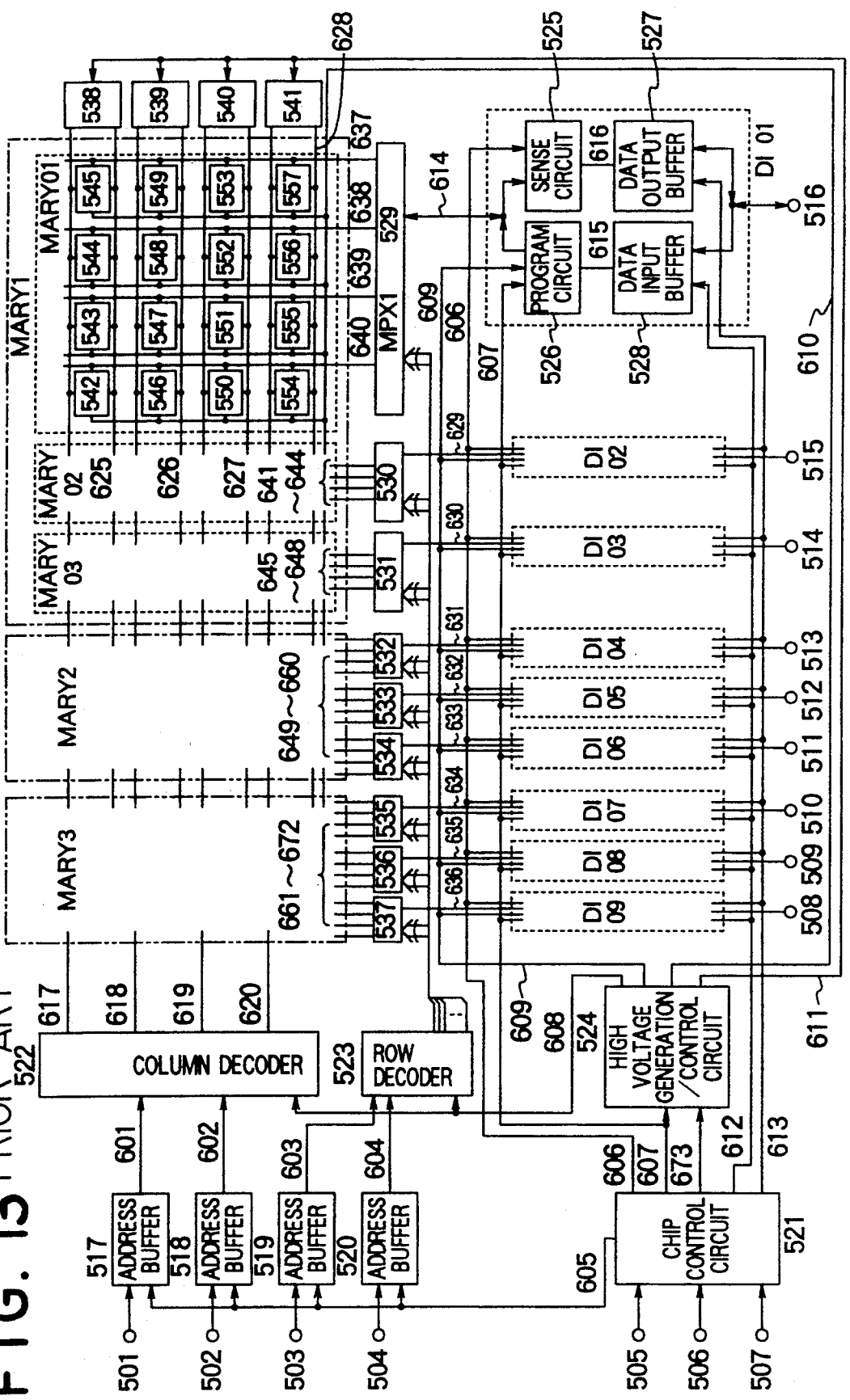
FIG. 13 is a block diagram of the circuit construction of the conventional EEPROM.

The effect of this embodiment will be obvious from the comparison between the prior art of FIG. 13 and this embodiment of FIG. 9. In the prior art of FIG. 13 four address inputs and nine outputs are provided to the 144 memory cells, while in this embodiment of FIG. 9 six address inputs and nine outputs are provided to 144 memory cells. In other words, according to this embodiment, data of two or more times (three times in this embodiment) larger as that in the prior art can be written in and read from the same number of memory cells as in the prior art, and thus the capacity of the semiconductor memory device can be remarkably increased as compared with the prior art. In other words, since the number of memory cells in this embodiment can be reduced to a half or less of that in the prior art or less if the amount of data to be stored is constant, the chip area of the integrated memory device can be greatly reduced to about a half. Thus, the cost can be effectively reduced. In addition, since data and parity bit are stored together in the semiconductor memory device of this embodiment, it is possible to check if error occurs in data, and hence the reliability of data can be improved. It is now assumed that parity of one bit is provided for data of 8 bits. While in the prior art, each one bit of data of 8 bits and one parity bit is stored in one memory cell. In this embodiment, data of 8 bits and parity of one bit are stored in three memory cells with every three-bit data being stored in one memory cell. Thus, the reliability of data can be improved while maintaining the large memory capacity.

Furthermore, according to this embodiment, since the relation between the value of data written in the memory cell and the threshold voltage of the memory cell or the relation between the threshold voltage of the memory cell and the value of data read from the memory cell is fixed so that the difference between pieces of written data or read data corresponding to adjacent threshold voltage values is one bit, error occurring in the adjacent threshold levels of the memory cell can be detected by parity bit, and thus the reliability of data can be improved.

We claim:

1. A method of writing data in a non-volatile semiconductor memory device having a plurality of memory cells, each being controllable for setting its threshold voltage, said method comprising the steps of:

determining at least three different threshold voltage values corresponding to at least three different data for each of said plurality of memory cells, each of said at least three different data being represented by a plurality of binary bits;

determining at least three different voltage signals to be applied to each memory cell for setting the memory cell at said at least three different threshold voltage values;

dividing the plurality of memory cells into a plurality of memory cell groups, each group including at least two memory cells;

selecting one of said plurality of memory cell groups for storing therein information represented by a combination of at least two data, each being one of said at least three different data, by allotting the at least two data to the memory cells included in said selected memory cell group, respectively;

applying to each of the memory cells included in said selected memory cell group one of said at least three different voltage signals for storing in the memory cell one of said at least three different data corresponding to the data allocated to the memory cell; and designating one of the binary bits, which represent one of said three different data to be stored in a selected one of said memory cells included in said selected memory cell group as a parity bit.

2. A method according to claim 1, wherein said at least three voltage signals have different voltage levels, respectively.

3. A method according to claim 1, wherein said at least three voltage signals are pulse signals having the same level, the same width and different numbers of pulses.

4. A method according to claim 1, wherein said at least three voltage signals have the same level and different pulse widths.

5. A method of reading data from a non-volatile semiconductor memory device having a plurality of memory cells, each having a threshold voltage which is settable at any one of at least three different levels corresponding to at least three different data, each being represented by a plurality of binary bits, wherein said plurality of memory cells are divided into a plurality of memory cell groups, each including at least two memory cells for storing information represented by a combination of at least two data, each being one of said at least three different data, said method comprising the steps of:

selecting one of said memory cell groups to be read out;

providing different reference voltages corresponding to said at least three different levels of the threshold voltage;

determining a level of the threshold voltage set for each of the memory cells included in said selected one memory cell group by successively comparing said threshold voltage set for the memory cell with said different reference voltages, thereby determining the data stored in each of the memory cells included in said selected memory cell group; and determining information stored in said selected memory cell group from a combination of the respective data stored in the memory cells included in said selected memory cell group, while processing one of a plurality of bits representing the combination of the respective data as a parity bit.

6. A non-volatile semiconductor memory device comprising:

a plurality of memory cells, each memory cell being able to store any one of different data represented by at least two binary bits, and the plurality of memory cells being divided into a plurality of memory cell groups, each group including at least two memory cells;

means for selecting one of said plurality of memory cell groups;

means for storing into the selected group of memory cells composite data including a parity bit and main data represented by a plurality of binary bits, while distributing all bits of the composite data into the memory cells; and means for reading said composite data including said main data and said parity bit stored in said selected memory cell group.

7. A non-volatile semiconductor memory device according to claim 6, wherein said reading means comprises:

means for providing different reference voltages corresponding to different levels of a threshold voltage to be set in said plurality of memory cells, said different levels being predetermined correspondingly to said plurality of different data;

means for detecting the threshold voltage set in each of the memory cells included in said selected memory cell group and determining a level of the detected threshold voltage by successively comparing said detected threshold voltage with said different reference voltages;

means for determining composite data including said parity bit and said main data which are written in said selected memory cell group from said predetermined levels of the threshold voltages respectively set in said memory cells of said selected memory cell group;

means for deciding whether said determined composite data is correct or not from the number of binary bits of a predetermined level included in said determined composite data; and means for determining said main data from said composite data when said composite data is decided to be correct.

8. A non-volatile semiconductor memory device according to claim 6, wherein different threshold voltage levels are predetermined for a threshold voltage to be set in each of said plurality of memory cells correspondingly to said plurality of different data and different voltage signals are determined to be applied to each memory cell for setting the memory cell at said different threshold voltage levels, respectively, said non-volatile semiconductor memory device further comprising:

means for applying to each memory cell of said selected memory cell group one of said different voltage signals corresponding to one of said different data represented by the bits of said composite data distributed to the memory cell.

9. A method of writing data in a non-volatile semiconductor memory device having a plurality of memory cells, each memory cell being controllable for setting its threshold voltage, said method comprising the steps of:

determining beforehand different threshold voltages to be set in each of said plurality of memory cells, said different threshold voltages corresponding to different data, each represented by at least two binary bits;

determining different voltage signals to be applied to each of said memory cells for setting the memory cell at said different threshold voltages, respectively;

dividing said plurality of memory cells into a plurality of memory cell groups, each group including at least two memory cells;

selecting one of said plurality of memory cell groups;

assigning all bits of composite data including one parity bit and main data represented by a plurality of binary bits to be written, to the memory cells of said selected memory cell group; and applying to each of the memory cells of said selected memory cell group one of said different voltage signals corresponding to the bits of said composite data assigned to the memory cell.

10. A method according to claim 9, wherein when the different threshold voltages are arranged in an order of magnitude, two of the different data corresponding to adjacent two threshold voltages are represented by the same binary bits other than one bit.

11. A method of reading data written in a non-volatile semiconductor memory device having a plurality of memory cells, each memory cell having a threshold voltage which is settable at any one of different levels corresponding to different data, each represented by at least two binary bits, said method comprising the steps of:

dividing said plurality of memory cells into a plurality of memory cell groups, each group including at least two memory cells;

providing different reference voltages correspondingly to said different levels of the threshold voltage;

comparing said threshold voltage set in each of said memory cells of said selected memory cell group with said different reference voltages, successively, and determining the level of said threshold voltage set in each memory cell of said selected memory cell group on the basis of said comparison;

determining composite data including a parity bit and main data written in said selected memory cell group from the levels of the respective threshold voltages, as determined, set in the memory cells included in said selected memory cell group;

determining whether said determined composite data is correct or not from a number of binary bits of a predetermined level included in the bits representing said composite data; and determining said main data from said composite data when said composite data is decided to be correct.

* * * * *